United States Patent
Gyoda

(10) Patent No.: US 8,450,838 B2
(45) Date of Patent: May 28, 2013

(54) ELECTRO-OPTIC APPARATUS, ELECTRONIC DEVICE, AND METHOD FOR MANUFACTURING ELECTRO-OPTIC APPARATUS

(75) Inventor: Kozo Gyoda, Chino (JP)

(73) Assignee: Seiko Epson Corporation, Tokyo (JP)

( * ) Notice: Subject to any disclaimer, the term of this patent is extended or adjusted under 35 U.S.C. 154(b) by 244 days.

(21) Appl. No.: 12/848,365

(22) Filed: Aug. 2, 2010

(65) Prior Publication Data

US 2011/0037059 A1   Feb. 17, 2011

(30) Foreign Application Priority Data

Aug. 11, 2009  (JP) .................................. 2009-186307
Aug. 11, 2009  (JP) .................................. 2009-186308

(51) Int. Cl.
*H01L 23/02*        (2006.01)
(52) U.S. Cl.
USPC ........... 257/680; 257/712; 257/724; 257/777; 257/E23.129; 257/E23.178; 438/116; 361/730; 361/735; 361/746; 349/58
(58) Field of Classification Search
USPC ................. 257/680, 712, 724, 777, E23.129, 257/E23.178; 438/116; 361/730, 735, 746; 349/58
See application file for complete search history.

(56) References Cited

U.S. PATENT DOCUMENTS

| | | | |
|---|---|---|---|
| 6,309,902 B1 | 10/2001 | Muramatsu | |
| 6,364,731 B1* | 4/2002 | Morita et al. | ................... 445/61 |
| 6,822,391 B2 | 11/2004 | Yamazaki et al. | |
| 6,956,325 B2 | 10/2005 | Yamazaki et al. | |
| 7,443,097 B2 | 10/2008 | Yamazaki et al. | |
| 7,852,620 B2 | 12/2010 | Kanbayashi | |
| 2007/0013822 A1 | 1/2007 | Kawata et al. | |

FOREIGN PATENT DOCUMENTS

| | | |
|---|---|---|
| JE | A 2002-055328 | 2/2002 |
| JP | A-2000-164351 | 6/2000 |
| JP | A-2000-299416 | 10/2000 |
| JP | A 2001-021870 | 1/2001 |
| JP | A-2002-324667 | 11/2002 |
| JP | A 2003-337322 | 11/2003 |
| JP | A-2003-337543 | 11/2003 |
| JP | A 2004-165684 | 6/2004 |
| JP | A-2004-349550 | 12/2004 |
| JP | A-2006-113436 | 4/2006 |
| JP | A-2007-025200 | 2/2007 |
| JP | A 2007-256770 | 10/2007 |
| JP | A 2008-165219 | 7/2008 |
| JP | A-2008-241805 | 10/2008 |
| WO | WO98/07065 | 2/1998 |

* cited by examiner

*Primary Examiner* — Tu-Tu Ho
(74) *Attorney, Agent, or Firm* — Oliff & Berridge, PLC

(57) ABSTRACT

An electro-optic apparatus has an electro-optic panel, driver semiconductor chips bonded onto the terminal portion of the electro-optic panel, and two protection films either or both of which are transparent, wherein the electro-optic panel is sealed by being sandwiched between the two protection films, and one protection film that covers the terminal portion has openings for exposing the driver semiconductor chips.

17 Claims, 16 Drawing Sheets

ELECTRO-OPTIC APPARATUS, ELECTRONIC DEVICE, AND METHOD FOR MANUFACTURING ELECTRO-OPTIC APPARATUS

BACKGROUND

1. Technical Field

The present invention relates to thin electro-optic apparatuses, electronic devices, and methods for manufacturing electro-optic apparatuses.

2. Related Art

The thin electro-optic apparatuses mentioned above include one disclosed in JP-A-2003-337322, a liquid crystal display having a liquid crystal panel made using a glass substrate thinner than 0.15 mm, a flexible printed circuit (FPC), a connector, and protection sheets that sandwich and combine other components while protecting them.

This liquid crystal display is energized by connecting the connector to an external apparatus equipped with a driver circuit.

Thin electro-optic apparatuses can be manufactured by methods including one disclosed in JP-A-2008-165219, polishing a silicon wafer to a thickness equal to or smaller than 100 μm and then bonding the obtained flexible driver IC onto a flexible display panel with or without an intervening FPC.

This publication lists some examples of the flexible display panel, such as liquid crystal displays, plasma displays, organic/inorganic EL (electroluminescence) displays, electrophoretic displays, and electrochromic displays.

As described above, the driver IC is bonded onto the flexible display panel by electric means; however, the use of the intervening FPC may possibly increase the output impedance, thereby reducing output signals, and this would affect display characteristics. It is desirable that the driver IC should be bonded directly onto the flexible display panel.

However, there are some problems with bonding a flexible driver IC directly onto the liquid crystal display according to JP-A-2003-337322. In so-called COG (chip-on-glass) bonding, in which a driver IC is bonded directly onto the terminal portion of a liquid crystal panel, the driver IC is polished to a thickness equal to or smaller than 100 μm in advance, and this reduced thickness makes it difficult to ensure the positional accuracy of bonding the driver IC onto a liquid crystal panel in plan view. Furthermore, such a thin driver IC should be handled with due care during bonding; otherwise, it may possibly be damaged.

COG bonding causes another problem later; protective sheets sandwich and combine the driver IC and other components, and thus the heat generated by the current flowing in the driver IC cannot be easily radiated.

SUMMARY

Advantages of some aspects of the invention are described below with reference to applications and embodiments.

Application 1

An electro-optic apparatus is provided as an aspect of the invention. It has an electro-optic panel, driver semiconductor chips bonded onto the terminal portion of the electro-optic panel, and two protection films either or both of which are transparent. The electro-optic panel is sealed by being sandwiched between the two protection films, and one protection film that covers the terminal portion has openings for exposing the driver semiconductor chips.

Under this configuration, the driver semiconductor chips can be bonded onto the terminal portion of the electro-optic panel even after the electro-optic panel is sealed with the protection films because of the openings provided to expose the terminal portion. The electro-optic panel can be easily handled thanks to the two protective films sealing it, and thus the terminal portion thereof can be bonded with the driver semiconductor chips with a high positional accuracy.

Furthermore, the bonded driving semiconductor chips are exposed through the openings, and thus any heat generated in the driving semiconductor chips by the operation of the electro-optic apparatus could be easily radiated out than in the case where the driving semiconductor chips and the electro-optic panel are completely sealed with protection films.

Application 2

An electro-optic apparatus is provided as a variation of the above-described application, wherein the electro-optic panel and the driving semiconductor chips are flexible.

Under this configuration, the electro-optic panel can be deformed when a bending stress is applied to the electro-optic apparatus, and the driver semiconductor chips can also follow the deformation. As a result, the electro-optic apparatus is almost free from defects in the electro-optic panel or the driver semiconductor chips due to bending stress; in other words, the electro-optic apparatus is flexible and highly reliable.

Application 3

An electro-optic apparatus is provided as a preferable variation of the above-described application, wherein the openings are large enough to surround the driver semiconductor chips, and the gap between the inner walls of each opening and the side walls of the corresponding driver semiconductor chip is filled with a moldable material so that the active surface of each driver semiconductor chip can be sealed.

Under this configuration, the terminal portion of the electro-optic panel is connected to the bonding portion of the driver semiconductor chips via a mold, and thus the resultant electro-optic apparatus is highly reliable in terms of internal connection.

Application 4

An electro-optic apparatus is provided as a preferable variation of the above-described application, wherein the moldable material is a resin material that becomes elastic after being cured.

Under this configuration, the moldable material, filled in the bonding portion of the driver semiconductor chips, is elastically deformed when a bending stress is applied to the electro-optic apparatus, and thus sealing is maintained with no detachment occurring. As a result, the electro-optic apparatus is excellently reliable in terms of internal connection.

Application 5

An electro-optic apparatus is provided as a preferable variation of the above-described application, wherein the electro-optic panel has a pair of substrates, one of the substrates is a glass substrate having the terminal portion, and the openings are formed so that any burrs occurring on edges of the openings should face in the direction opposite to the terminal portion.

Under this configuration, any burrs on the openings cannot reach the glass substrate even after the electro-optic panel is sealed with the two protection films, and thus presses by the burrs, which may possibly damage or break the glass substrate, can be avoided. Note that such burrs occur during the formation of the openings; for example, openings formed with a punching die often have burrs facing in the direction of punching on their edges.

Application 6

An electro-optic apparatus is provided as a preferable variation of the above-described application, wherein each driver semiconductor chip, which is exposed through the corresponding opening, has the surface thereof covered at least in part with a heat radiation material.

Under this configuration, heat generated in the driver semiconductor chips during the operation of the electro-optic apparatus can be radiated efficiently thanks to the heat radiation materials.

Application 7

An electro-optic apparatus is provided as a variation of the above-described application, wherein the electro-optic panel is an organic EL panel, which carries organic EL elements.

Under this configuration, the resultant electro-optic apparatus can radiate out, via the heat radiation materials, heat generated in the driver semiconductor chips during the operation of the organic EL panel.

Application 8

An electronic device is provided as another aspect of the invention. It is equipped with an electro-optic apparatus according to the above-described application.

Under this configuration, the resultant electronic device is thin, eco-friendly, and highly reliable.

Application 9

A method for manufacturing electro-optic apparatuses is provided as another aspect of the invention. To manufacture an electro-optic apparatus that has an electro-optic panel sandwiched between two protection films either or both of which are transparent, this method includes sealing and bonding. In the sealing process, the electro-optic panel is sealed by being sandwiched with one protection film that has openings corresponding in position to the terminal portion of the electro-optic panel and the other protection film. In the bonding process, driver semiconductor chips are bonded onto the terminal portion through the openings.

In this method, sealing of the electro-optic panel precedes bonding of the driver semiconductor chips; thus, in the bonding process, the electro-optic panel can be easily handled and bonded with the driver semiconductor chips with a high positional accuracy. Also, the bonded driver semiconductor chips are exposed through the openings and thus can easily radiate out heat generated therein during the operation of the electro-optic apparatus. In other words, this method makes it possible to manufacture electro-optic apparatuses at a high yield, with an improved heat radiation, and with a high positional accuracy of the driver semiconductor chips with respect to the electro-optic panel.

Application 10

A method for manufacturing electro-optic apparatuses is provided as a preferable variation of the above-described application; it further includes molding. In the molding process, a moldable material is filled in the gap between the inner walls of the openings and the side walls of the driver semiconductor chips and then cured so that the active surface of the driver semiconductor chips can be sealed. Note that each opening is formed in advance on one of the protection films with a size large enough to surround the corresponding driver semiconductor chip.

This method ensures proper sealing of the driver semiconductor chips and the terminal portion in the openings of the protection film; thus, resultant electro-optic apparatuses are highly reliable in terms of internal connection.

Application 11

A method for manufacturing electro-optic apparatuses is provided as a preferable variation of the above-described application, wherein the moldable material is a resin material that becomes elastic after being cured.

In an electro-optic apparatus manufactured using this method, the moldable material, filled in the bonding portion of the driver semiconductor chips, is elastically deformed when a bending stress is applied to the electro-optic apparatus, and thus sealing is maintained with no detachment occurring. As a result, the electro-optic apparatus becomes more reliable in terms of internal connection.

Application 12

A method for manufacturing electro-optic apparatuses is provided as a variation of the above-described application; it further includes thinning. In the thinning process, the bonded driver semiconductor chips are thinned by dry-etching.

In this method, the driver semiconductor chips are thinned after being bonded; thus, the driver semiconductor chips are easier to handle than in the case where they are thinned before being bonded, and this reduces the risk of damage to the driver semiconductor chips during handling and improves the yield. Furthermore, in an electro-optic apparatus manufactured using this method, the thinned driver semiconductor chips can be flexibly deformed when a bending stress is applied to the electro-optic apparatus, and thus sealing of the bonding portion of the driver semiconductor chips is maintained with no detachment occurring. As a result, the electro-optic apparatus becomes much more reliable in terms of internal connection.

Application 13

A method for manufacturing electro-optic apparatuses is provided as a preferable variation of the above-described application; it further includes covering the surface of each driver semiconductor chip at least in part with a heat radiation material.

In an electro-optic apparatus manufactured using this method, heat generated in the driver semiconductor chips during the operation of the electro-optic apparatus can be radiated efficiently thanks to the heat radiation materials.

Application 14

Another method for manufacturing electro-optic apparatuses is provided; it includes bonding, dry-etching, and sealing. In the bonding process, driver semiconductor chips are bonded onto the terminal portion of an electro-optic panel. In the dry-etching process, the bonded driver semiconductor chips are thinned by dry-etching. In the sealing process, the electro-optic panel, which has the thinned driver semiconductor chips bonded thereonto, is sealed by being sandwiched with two protection films either or both of which are transparent.

In this method, bonding of the driver semiconductor chips precedes thinning of them. Thus, the driver semiconductor chips can be more easily handled during bonding and bonded with a higher positional accuracy than in the case where thinning precedes bonding.

Furthermore, the sealing of the electro-optic panel and the thinned driver semiconductor chips with protection films protects the sealed components from changes in temperature, humidity, exposure to light, and other environmental factors. As a result, the resultant electro-optic apparatus is not only thin but also highly reliable.

Application 15

A method for manufacturing electro-optic apparatuses is provided as a variation of the above-described application, wherein the electro-optic panel is flexible, and the driver semiconductor chips have a thickness in the range of 5 to 50 μm after undergoing dry-etching.

In an electro-optic apparatus manufactured using this method, the electro-optic panel can be deformed when a bending stress is applied to the electro-optic apparatus, and the driver semiconductor chips can also follow the deformation. As a result, the electro-optic apparatus is flexible and highly reliable in terms of internal connection.

Application 16

A method for manufacturing electro-optic apparatuses is provided as a preferable variation of the above-described application, wherein a heat radiation material is inserted between each driver semiconductor chip and each protection film before sealing.

In an electro-optic apparatus manufactured using this method, heat generated in the driver semiconductor chips during operation can be radiated efficiently thanks to the heat radiation materials.

Application 17

A method for manufacturing electro-optic apparatuses is provided as a variation of the above-described application, wherein the electro-optic panel is an organic EL panel, which carries organic EL elements.

An electro-optic apparatus manufactured using this method has the driver semiconductor chip bonded onto the organic EL panel with a high positional accuracy and can radiate out heat generated in the driver semiconductor chip.

BRIEF DESCRIPTION OF THE DRAWINGS

The invention will be described with reference to the accompanying drawings, wherein like numbers reference like elements.

FIG. 16A shows a display, and FIG. 16B shows a personal digital assistant (PDA).

DESCRIPTION OF EXEMPLARY EMBODIMENTS

The following describes embodiments of some aspects of the invention with reference to drawings. Note that the drawings may be on different scales for easy understanding.

The following description of embodiments includes expressions like "above something." These expressions mean that a thing may be placed directly on something, indirectly on something (intervened by another thing), or directly in part and indirectly in other part on something.

Embodiment 1

Electro-Optic Apparatus

The following describes an organic EL apparatus, an example of electro-optic apparatuses according to Embodiment 1 of an aspect of the invention, with reference to FIGS. 1 to 4.

Figure 1:
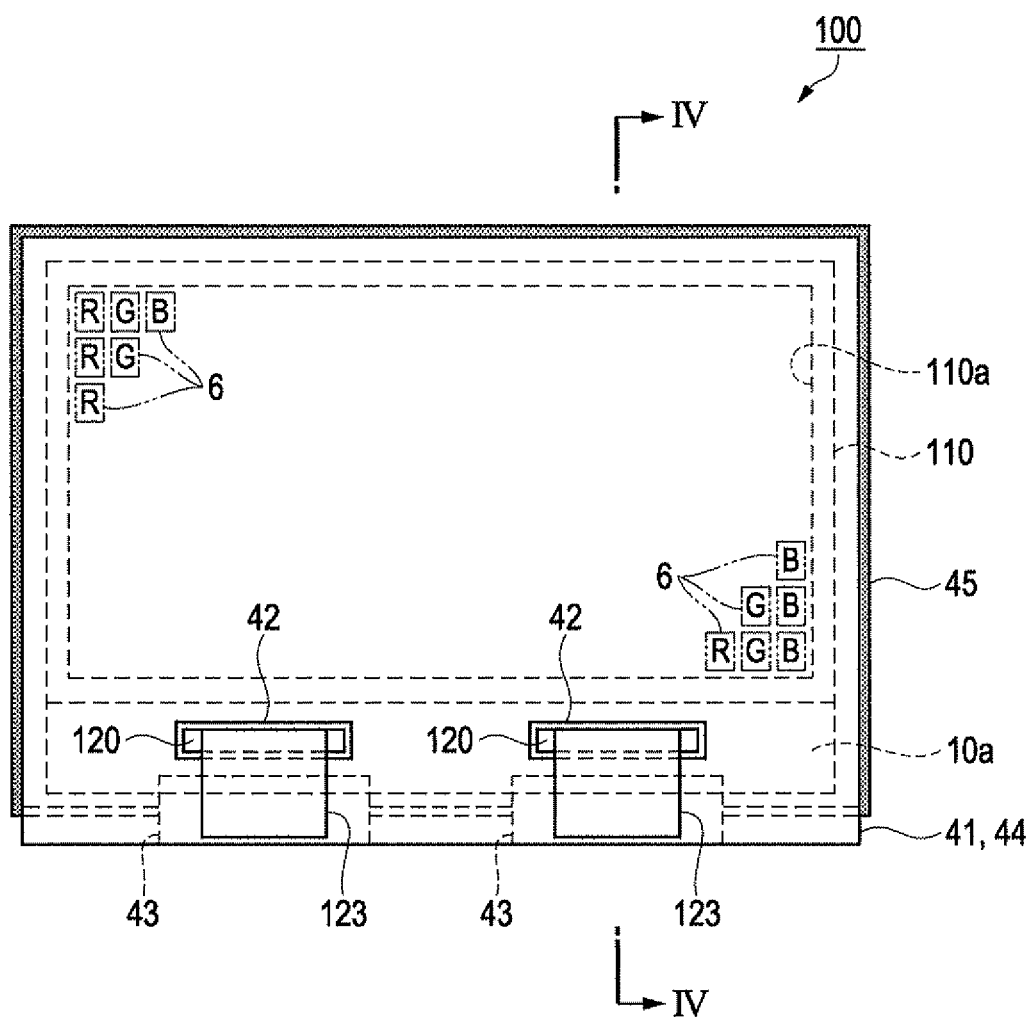
FIG. 1 is a schematic plan view of a configuration of an organic EL apparatus according to Embodiment 1.
Figure 2:
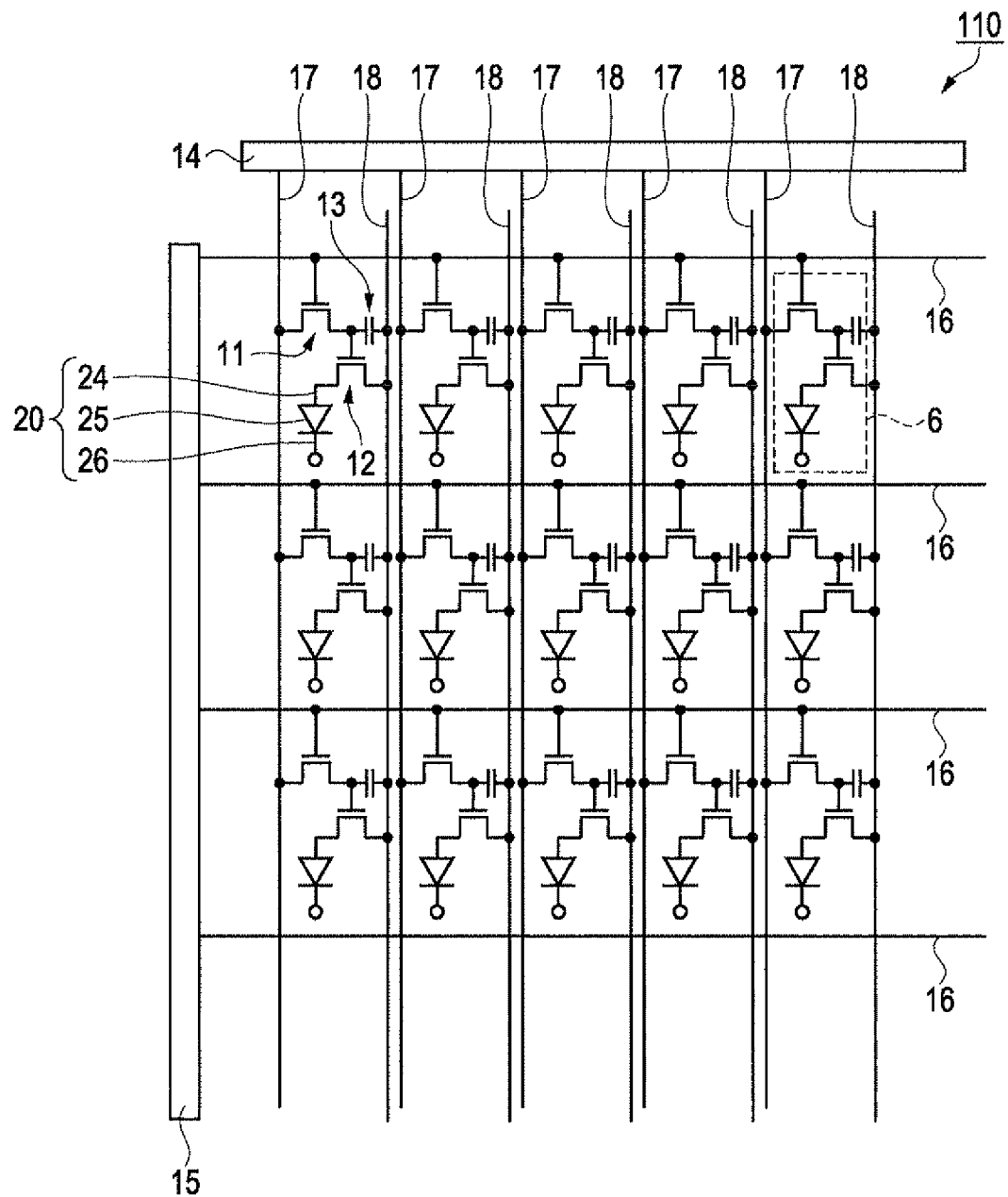
FIG. 2 is an equivalent circuit diagram illustrating an electric configuration of an organic EL apparatus according to Embodiment 1.
Figure 3:
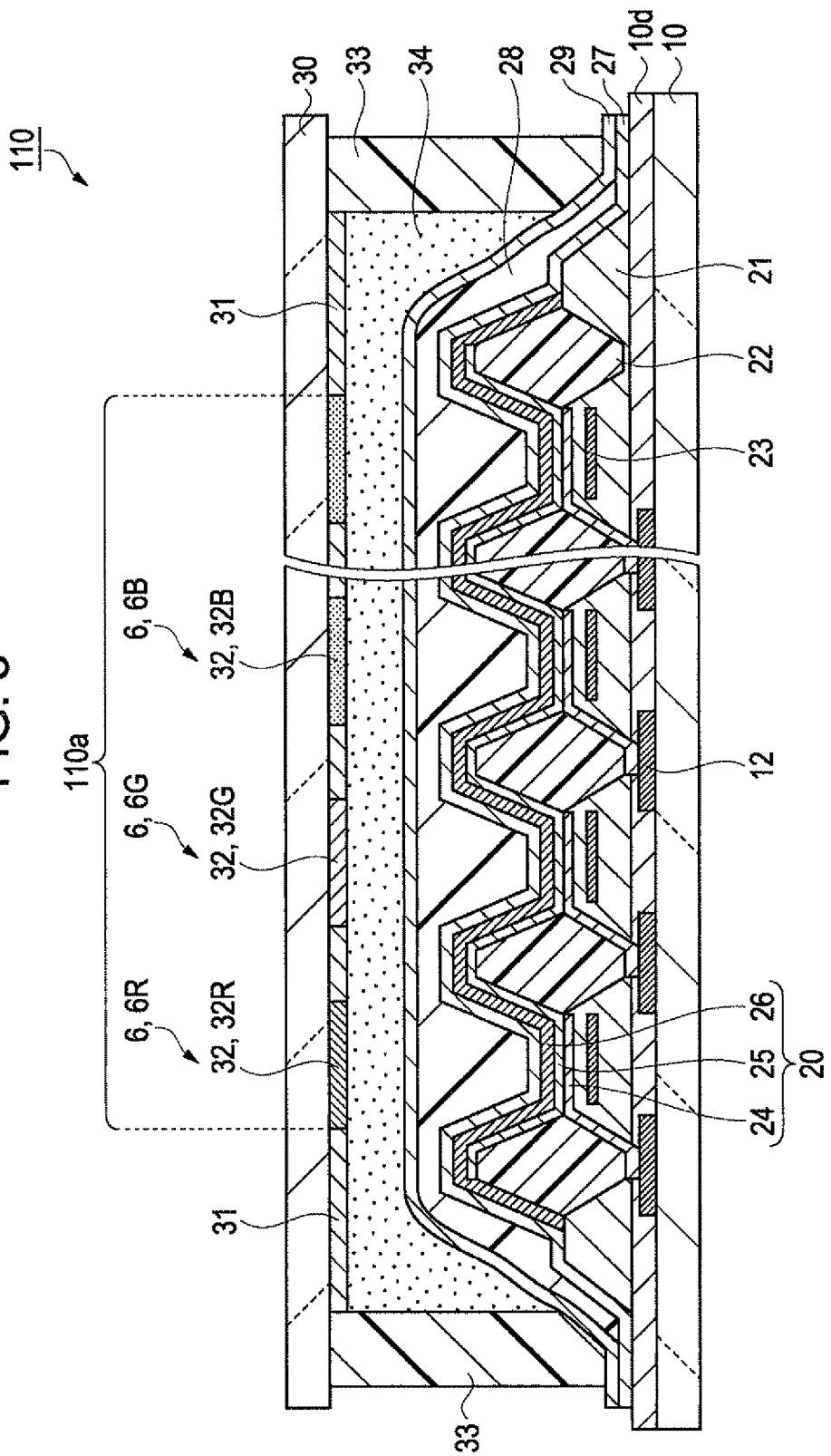
FIG. 3 is a schematic cross-sectional view of the structure of an organic EL panel.
Figure 4:
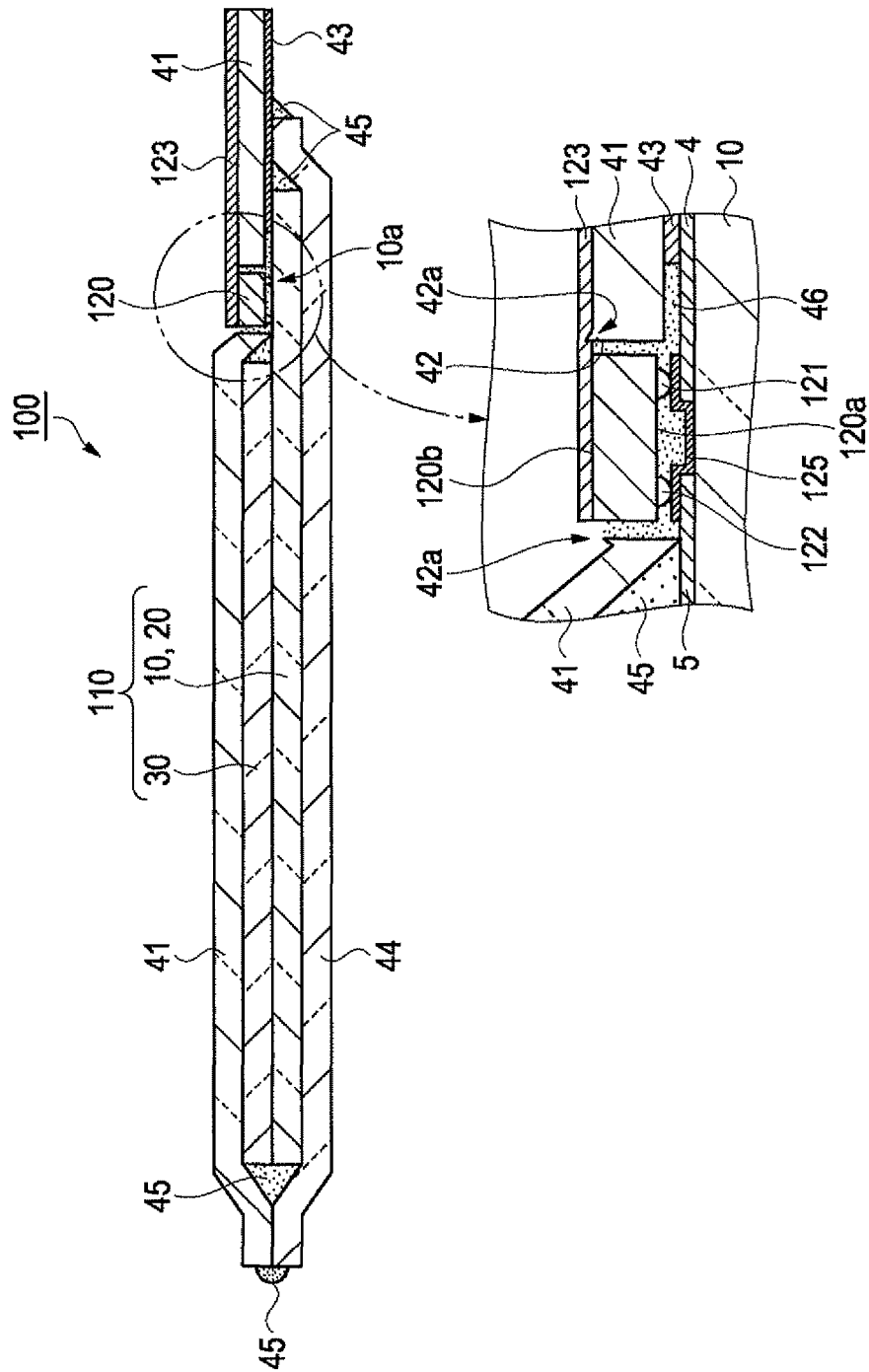
FIG. 4 is a schematic cross-sectional view of an organic EL apparatus taken along line IV-IV in FIG. 1.

FIG. 1 is a schematic plan view of a configuration of the organic EL apparatus, FIG. 2 is an equivalent circuit diagram illustrating an electric configuration of the organic EL apparatus, FIG. 3 is a schematic cross-sectional view of the structure of the organic EL panel, and FIG. 4 is a schematic cross-sectional view of the organic EL apparatus taken along line IV-IV in FIG. 1.

As shown in FIG. 1, the organic EL apparatus 100, which is an electro-optic apparatus according to Embodiment 1, has an organic EL panel 110 and two protection films 41 and 44. The organic EL panel 110 has a square shape in plan view and is sealed by being sandwiched between the protection films 41 and 44 (see FIG. 4 for details).

The organic EL panel 110, which is an electro-optic panel, has pixels 6. Each pixel 6 has a roughly rectangular shape and emits red (R), green (G), or blue (B) light. Pixels 6 of the same color are aligned parallel to the short sides, and pixels 6 of different colors are repeated parallel to the long sides, constituting a luminous area 110a of so-called stripe pixel arrangement. Note that the order of pixels 6 of different colors is never limited to that shown in the drawing.

The organic EL panel 110 has a terminal portion 10a, onto which some driver ICs 120 (in the drawing, two driver ICs 120) are bonded for the use as the driver semiconductor chips. Each driver IC 120 has a thin rectangular shape in plan view; for example, the short side measures 1.5 to 2 mm in length, where as the long side 15 to 20 mm in length. One of the protections films 41 and 44 (in the drawing, the protection film 41) has openings 42, which are located in the terminal portion 10a and have a rectangular shape, individually surrounding the driver ICs 120. In other words, the driver ICs 120 are exposed via the openings 42.

Each exposed driver IC 120 is covered with a heat radiation material 123, which extends to one end of the protection film 41. The heat radiation materials 123 are made from, for example, a heat transfer body such as a metal foil, or a resin film obtained by laminating heat transfer bodies. In particular, Pyrolytic Graphite Sheet (PGS; Panasonic Corporation) can be suitably used because of its flexibility and excellent heat transfer. Anyway, each driver IC 120 and optionally other components is attached to a piece of heat transfer body via an adhesive layer.

The protection film 41 further has connections 43 formed on its inner surface. The connections 43 are electrically connected to the terminal portion 10a as with the driver ICs 120 once the two protection films 41 and 44 seal the organic EL panel 110, and can be formed by, for example, making an ITO (indium tin oxide) film or some other transparent and conductive film on the inner surface of the protection film 41 and then patterning the film.

As shown in FIG. 2, the organic EL panel 110 is an active-matrix organic EL panel carrying thin film transistors (TFTs)

and has scanning lines 16 and data lines 17, which are insulated and cross each other, and power lines 18 extending along the data lines 17.

The areas partitioned by the scanning lines 16 and the data lines 17 carry the pixels 6, which are arranged in the directions in which the scanning lines 16 and the data lines 17 extend, constituting a matrix.

Each pixel 6 has an organic EL element 20, which is constituted by a positive electrode 24, an organic functional layer 25, and a negative electrode 26, and is also equipped with a switching TFT 11, a driving TFT 12, and a capacitor 13, which constitute a circuit for driving and controlling the organic EL element 20. The organic functional layer 25 can be obtained by, for example, laminating a hole injection layer, a hole transport layer, a luminescent layer, and an electron transport layer in this order; a hole is injected from the positive electrode 24, an electron is injected from the negative electrode 26, and then the hole and the electron are coupled in the luminescent layer, leading to excitation and light emission.

The constitution of the organic functional layer 25 is never limited to this; it may further contain an intermediate layer and/or an electron injection layer for more efficient luminescence or may have any other known constitution.

The data lines 17 are connected to a data line driving circuit 14, which has a shift register, a level shifter, a video line, and an analogue switch. The scanning lines 16 are connected to a scanning line driving circuit 15, which has a shift register and a level shifter.

The scanning line driving circuit 15 distributes scanning signals via the scanning lines 16 to the switching TFTs 11 and turns them on, and then the data line driving circuit 14 supplies video signals via the data lines 17 to the capacitors 13, and the video signals are stored there, turning each driving TFT 12 on or off in accordance with the state of the corresponding capacitor 13. Then, each positive electrode 24 is electrically connected via the driving TFT 12 to the power line 18, or turned on, and the power line 18 supplies driving current to the positive electrode 24, and then current flows via the organic functional layer 25 to the negative electrode 26. As a result, the luminescent layer of each organic functional layer 25 emits light with an intensity corresponding to the current flowing between the positive electrode 24 and the negative electrode 26.

The driver ICs 120 described above, which are for driving the organic EL panel 110, are configured to supply power to either or both of the data line driving circuit 14 and the scanning line driving circuit 15, and the power lines 18. For example, the scanning line driving circuit 15 can be formed in the periphery of the luminous area 110a the organic EL panel 110 to extend along a short side of the area as a part of the circuit portion. In this case, the driver ICs 120 are configured to contain the constitution of the data line driving circuit 14.

As shown in FIG. 3, the organic EL panel 110 has two substrates: One is an element substrate 10, which carries the organic EL elements 20, and the other is a sealing substrate 30, which is formed to face the element substrate 10 and seal the organic EL elements 20.

The element substrate 10 has the above-described circuit portion 10d and a flattening layer 21 that covers the circuit portion 10d, both formed thereon. Each organic EL element 20 is positioned above a reflection layer 23, which is located in the area defined by partitions 22 provided above the flattening layer 21. The flattening layer 21 and the negative electrode 26, which is a common electrode for the organic EL elements 20, are covered with an electrode protection layer 27, an organic buffer layer 28, and a gas barrier layer 29.

In this embodiment, each organic EL element 20 emits white light through the operation of its organic functional layer 25.

The sealing substrate 30 has color filters 32, each of which is any of three colored layers 32R, 32G, and 328 and corresponds in position to each pixel 6, and a light-shielding layer 31 for separating the colored layers 32R, 32G, and 32B.

The element substrate 10 and the sealing substrate 30 face each other across a sealing resin layer 34 and are sealed and bonded with a sealing material 33.

Configured as above, the organic EL panel 110 provides a top-emission EL panel; white light is generated in each organic functional layer 25, reflected by the reflection layer 23, passing through the color filter 32, and then emitted from the sealing substrate 30.

The element substrate 10 is made of, for example, transparent and alkali-free glass; however, it may be made of an optically non-transparent material such as silicon because the organic EL panel 110 is a top-emission EL panel.

The driving TFTs 12, which are held on the circuit portion 10d, are each connected to the corresponding positive electrode 24 at their drain via a contact hole formed on the flattening layer 21.

The positive electrodes 24 is made of, for example, ITO, IZO (Indium Zinc Oxide), or some other transparent and conductive film.

The reflection layers 23, which are overlapped with the positive electrodes 24, are made of a light-reflecting metallic material such as an aluminum alloy.

Note that the material of the positive electrodes 24 does not always have to be optically transparent because the organic EL panel 110 is a top-emission EL panel. When the positive electrodes 24 are made of a light-reflecting material, such as an aluminum alloy, rather than an optically transparent material, the reflection layers 23 can be omitted.

The partitions 22, which practically separate the pixels 6 (or the organic EL elements 20), are made of, for example, a light-shielding acrylic resin.

The organic functional layer 25 is formed to cover the positive electrodes 24 and the partitions 22; in this embodiment, it is constituted by a hole injection layer, a hole transport layer, a luminescent layer, and an electron transport layer laminated in this order, although depicted as a monolayer in FIG. 3. The hole injection layer is made of, for example, a triarylamine polymer (ATP). The hole transport layer is made of, for example, a triphenylamine derivative (TPD).

To emit white light, the luminescent layer contains a styrylamine luminous material and an anthracene dopant (blue), or a styrylamine luminous material and a rubene dopant (yellow). The electrode transport layer is made of, for example, an aluminum-quinolinol complex (Alq3). Vacuum deposition or any other possible methods can be used to form the layers constituting the organic functional layer 25.

The negative electrode 26 is optically transparent and made of, for example, a magnesium-silver alloy (Mg—Ag alloy). An electron injection buffer layer, which is made of lithium fluoride (LiF) or the like, may be added under the negative electrode 26.

The electrode protection layer 27 is made of, for example, silicon oxide, silicon oxynitride, or some other silicon compound so that it can be optically transparent, strongly adhesive, waterproof, and gas-repellent. Preferably, the thickness of the electrode protection layer 27 is in the range of 100 to 400 nm, inclusive; if it exceeds 400 nm, cracks may possibly occur in the partitions 22, which are covered with the electrode protection layer 27, as a result of the stress generated. PVD (physical vapor deposition), CVD (chemical vapor deposition), ion plating, or any other possible methods can be used to form the electrode protection layer 27.

The organic buffer layer 28 and the gas barrier layer 29 cover the electrode protection layer 27. The organic buffer layer 28 is made of a thermosetting epoxy resin or the like and formed by screen printing, slit coating, ink jet coating, or some other possible method. Although the electrode protection layer 27 has an uneven surface reflecting the shape of the partitions 22, unevenness is reduced by the organic buffer layer 28. The organic buffer layer 28 also relaxes the stress resulting from warping or expansion in the element substrate 10, thereby preventing the detachment of the electrode protection layer 27 and cracks in the gas barrier layer 29. The thickness of the organic buffer layer 28 is preferably on the order of 3 to 5 μm.

As for the gas barrier layer 29, possible materials and formation methods are the same as those for the electrode protection layer 27. The gas barrier layer 29 functions as a sealant to protect the organic EL elements 20 from moisture and oxygen.

The sealing substrate 30 is made of, for example, transparent and alkali-free glass, as with the element substrate 10.

The sealing material 33 is placed to seal the non-luminescent space existing between the element substrate 10 and the sealing substrate 30, around the sealing substrate 30 like a frame, and made of a material of low water-permeability, for example, a strong adhesive obtained by combining an epoxy resin with an acid anhydride (a hardener) and a silane coupling agent (a hardening promoter).

The sealing resin layer 34 is formed to completely fill the space defined by the element substrate 10, the sealing substrate 30, and the sealing material 33, and made of a material of high optical transparency such as an acrylic, epoxy, or urethane resin. Preferably, an epoxy resin is used so that the sealing resin layer 34 can be resistant against heat and moisture.

The light-shielding layer 31, which separates the colored layers 32R, 32G, and 32B, is made of a light-shielding material such as chromium (Cr). An overcoat layer may be added to cover the color filters 32 and the light-shielding layer 31.

The organic EL elements 20 for emitting white light and the color filters 32 corresponding in position to them allow the organic EL panel 110 to have red-light pixels 6R, green-light pixels 6G, and blue-light pixels 6B, although they are collectively referred to as pixels 6 unless the indication of color is needed. In this way, the organic EL panel 110 supports full-color display or full-color illumination.

In this embodiment, the element substrate 10 and the sealing substrate 30 are sheets of alkali-free glass having a thickness on the order of 0.3 to 0.7 mm, and they are bonded together after the above-described components are formed thereabove. Then, the substrates are thinned by etching, mechanical polishing, chemical polishing, or some other possible treatments.

For example, the final thickness of the element substrate 10 and the sealing substrate 30 is on the order of 10 to 100 μm; it is preferably in the range of 10 to 50 μm. Preferably, the total thickness of the bonded substrates and other components is equal to or less than 200 μm so that the organic EL panel 110 can be flexible.

The organic EL panel 110 is thin and flexible as described above and thus is susceptible to damage from external impact; it should be handled with care during bonding of the driver ICs 120 thereonto. Any warp makes it difficult to ensure positional accuracy in placing the driver ICs 120. In actual production, every effort should be made for high and consistent yield.

To this end, the organic EL apparatus 100, which is according to this embodiment, has a structure in which the organic EL panel 110 is sealed (laminated) by being sandwiched between two protection films 41 and 44, as shown in FIG. 4.

Also, the openings 42, which are formed on the protection film 41 to cover the terminal portion 10a, allow the driver ICs 120 to be bonded after the organic EL panel 110 is sealed.

In each driver IC 120, bumps 121 and 122 of the active surface 120a are welded under pressure for electric connection via an anisotropic conductive film (ACF) sheet 125 to terminals 4 and 5 formed above the terminal portion 10a. The bumps 121 and 122 are electrodes for bonding and made of gold (Au) or the like on the land (electrode) of the active surface 120a.

As described above, each driver IC 120 has a thin rectangular shape in plan view; it is made from a silicon wafer having a thickness in the range of 300 to 400 μm. In this embodiment, the driver ICs 120 are thinned after bonding to a thickness on the order of 5 to 50 μm. This ensures the reliability of the resultant organic EL apparatus 100 in terms of internal connection because the driver ICs 120 can be deformed by following any bending stress and other kinds of stress applied to the organic EL apparatus 100. For the balance of productivity and reliability, the final thickness of the driver ICs 120 is preferably in the range of 10 to 30 μm. Specific treatments for thinning the driver ICs 120 will be described later.

The space defined by the side walls of the bonded driver ICs 120 and the inner walls of the openings 42 is filled with a moldable material 46, and thus the active surface 120a is sealed so that the reliability in terms of internal connection can be ensured. The moldable material 46 is a resin material that becomes elastic after being cured and thus can follow any deformation of the organic EL apparatus 100. An example of eligible moldable materials is TSE3996, a silicone vapor barrier from Momentive Performance Materials Inc. (former GE Toshiba Silicone).

As described above, the driver ICs 120 generate a considerable amount of heat from current flow during the operation of the organic EL panel 110. Thus, the surface 120b of each driver IC 120 opposite to the active surface 120a has a heat radiation material 123 attached thereto.

The two protection films 41 and 44, which seal the organic EL panel 110, are preferably transparent resin films of low gas-permeability so that they can block out moisture, gas, and any other foreign substances.

Examples of eligible resin films include ones made of PET (polyethylene terephthalate), PEN (polyethylene naphthalate), or some other kind of polyester, and ones made of PES (polyether sulfone), PC (polycarbonate), PE (polyethylene), or some other similar resin; laminates of these films may be used instead. The thickness of each resin film or laminate is about 50 μm.

Each resin film or laminate has its surface for sealing the organic EL panel 110 coated with an adhesive. An example of eligible adhesives is a thermosetting epoxy resin. A viscous adhesive may be used instead; it helps repair.

With the surface coated with an adhesive facing one another, the two protection films 41 and 44 are laminated to seal the organic EL panel 110. Although the obtained laminate potentially contains some spaces around the organic EL panel 110, such spaces are filled with a sealing resin 45 before lamination so that the vapor barrier, or moisture-tightness, of the organic EL elements 20 can be ensured. In other words, the organic EL panel 110 and the sealing resin 45 are sealed together. The sealing resin 45 protrudes in part, making projections on the edges of the protection films 41 and 44.

As described above, the protection film 41 has connections 43 formed on its inner surface (the surface used for sealing), and the connections 43 are electrically connected via the terminal 4 to the terminal portion 10*a* once the organic EL panel 110 is sealed. The connections 43 are exposed in part, and the exposed portions are connected to an external driving circuit.

In this embodiment, pressing is used as a method for forming the openings 42 on the protection film 41. Pressing allows several openings 42 to be formed at a time and thus is efficient; however, it leaves burrs 42*a* on the edge of the openings 42. If such burrs 42*a* directly touch the terminal portion 10*a* of the element substrate 10 when the protection film 41 is attached to the organic EL panel 110, stress concentration occurs at the point of contact, leading to flaws and cracks, and these flaws and cracks may possibly damage the glassy element substrate 10. To avoid this, the protection film 41 is attached in such a manner that any burrs occurring on the edge of the openings 42 should face outward, or in the direction opposite to the terminal portion 10*a*.

As described above, the organic EL panel 110 is a top-emission EL panel; thus, the protection film 41, which covers the sealing substrate 30, should be transparent so that light can pass through. However, the protection film 44, which covers the element substrate 10, may be non-transparent because the element substrate 10 is not involved with light emission; for example, it may be a laminate of a heat transfer body, such as a metal thin film, and a non-transparent resin film. The heat transfer body helps radiation of the heat generated as a result of light emission by the organic EL elements 20.

Method for Manufacturing Electro-Optic Apparatuses

Figure 5:
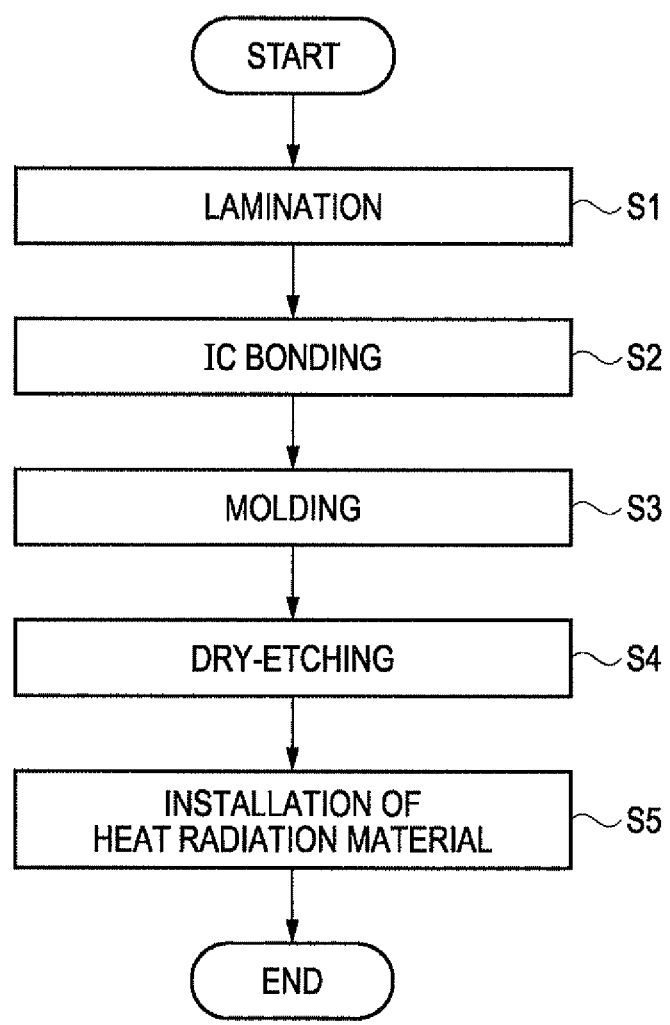
FIG. 5 is a flow chart that shows a manufacturing method of an organic EL apparatus according to Embodiment 1.

The following describes a method for manufacturing an organic EL apparatus, an example of the electro-optic apparatus according to Embodiment 1 of an aspect of the invention, with reference to FIGS. 5 to 8. FIG. 5 is a flow chart that shows a manufacturing method of the organic EL apparatus, FIGS. 6A and 6B are schematic diagrams for an illustration of lamination, FIGS. 7A to 7C are schematic diagrams for an illustration of IC bonding, and FIGS. 8A to 8D are schematic diagrams for an illustration of dry-etching.

As shown in FIG. 5, a method for manufacturing the organic EL apparatus 100, which is according to Embodiment 1, includes lamination (S1), IC bonding (S2), molding (S3), dry-etching (S4), and installation of heat radiation material (S5). Note that preparation of the organic EL panel 110 can be completed by any known methods, and thus no description is given to it.

Figure 6A:
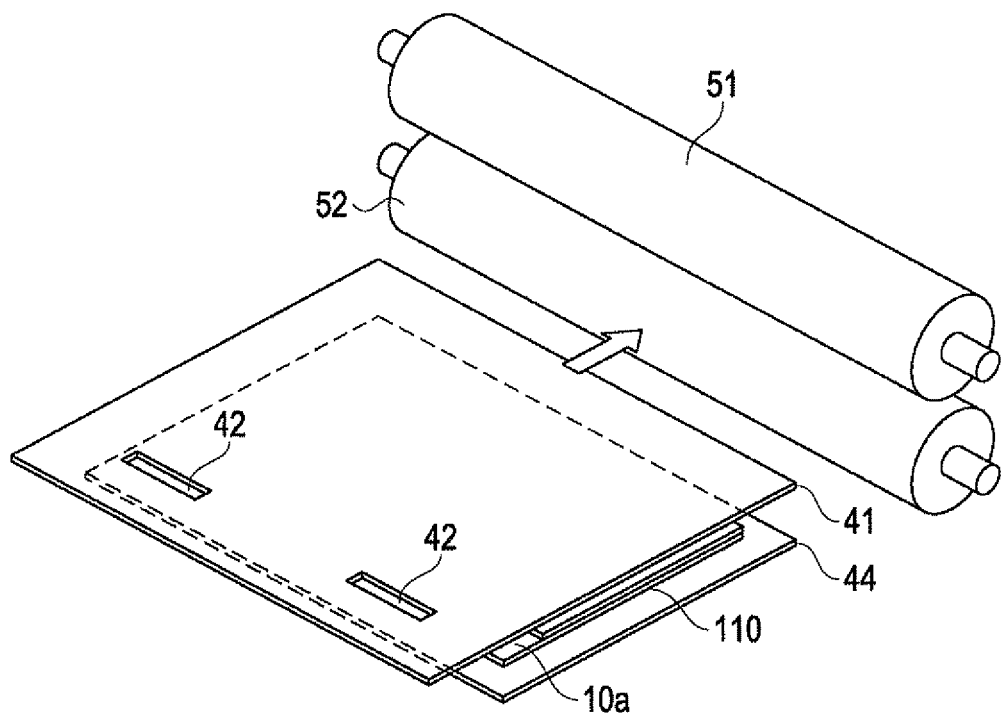
FIGS. 6A and 6B are schematic diagrams for an illustration of lamination.

In Step S1, lamination, components are stacked to prepare a lead-up as shown in FIG. 6A, and the obtained lead-up is loaded into a laminator. More specifically, an organic EL panel 110 is placed on a protection film 44, and the obtained composition is covered with a protection film 41. Although not clear in FIG. 6A, the components are stacked with their positions in plan view aligned. This step may be performed under normal conditions or with the pressure reduced; however, a reduced pressure is advantageous to sealing and thus is used here. The laminator has a pressure-controlled chamber, although FIG. 6A shows pressure rollers 51 and 52 only.

After the lead-up is loaded into the laminator, the chamber is depressurized. This removes air (bubbles) from the lead-up.

The pressure rollers 51 and 52, whose surface is made of a heat conductive elastomer, are heated to a temperature in the range of 80 to 120° C.

Lamination (sealing) begins from the side of the lead-up opposite to the terminal portion 10*a* of the organic EL panel 110 and proceeds in the direction indicated by the arrow in FIG. 6A. The pressure rollers 51 and 52 heat and compress the organic EL panel 110 and the protection films 41 and 44 sandwiching it so that they can be combined by bonding. Note that the protection films 41 and 44 are bonded to each other in the area not occupied by the organic EL panel 110.

Since lamination proceeds in the direction from a side to the opposite side, bubbles (air) remaining in the components, if any, would be extruded from the rear end.

Figure 6B:
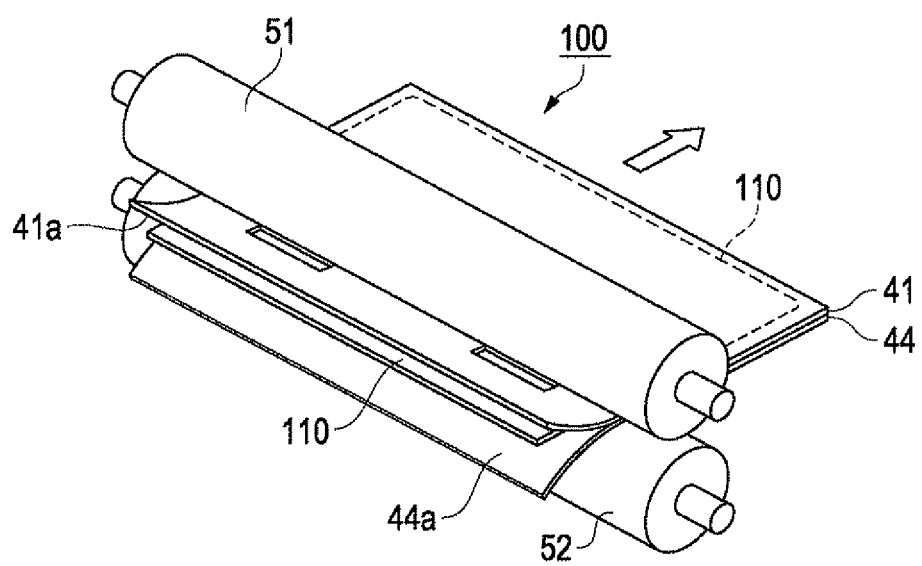

As described above, the resultant laminate often contains some spaces around the organic EL panel 110, and thus a sealing resin 45 is applied in advance to the four edges and the terminal portion 10*a* of the organic EL panel 110. Thus, an excess of the sealing resin 45 protrudes, making projections on the edges of the protection films 41 and 44. Then, the laminate of an organic EL apparatus 100 is discharged by the pressure rollers 51 and 52 as shown in FIG. 6B. In this way, lamination is completed.

Desirably, annealing is performed here so that residual stress can be removed from the laminate of the organic EL apparatus 100. The reduced pressure may be maintained or returned to normal. Although in this embodiment the protection films 41 and 44 have their adhesion surfaces 41*a* and 44*a* coated with an adhesive as shown in FIG. 6B, hot-melt resin films containing a cross-linking component may be used instead; in such a case, it is particularly preferable that cross-linking be completed by annealing at about 100° C.

The type of laminator is never limited to roller laminator; the laminator does not always have to be equipped with the pressure rollers 51 and 52. For example, the laminator may be a diaphragm vacuum laminator, in which the lead-up is heated and compressed on a hot plate by a flexible rubber sheet pressed thereon using pressure difference. Annealing, if needed, is finished in this way, and manufacturing proceeds to Step S2.

Figure 7A:
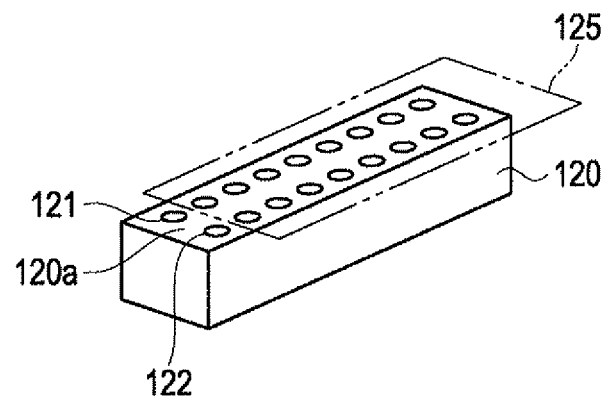
FIGS. 7A to 7C are schematic diagrams for an illustration of IC bonding.

In Step S2, IC bonding, an ACF sheet 125 cut to a predefined size is attached to the active surface 120*a* of each driver IC 120 as shown in FIG. 7A. ACF is usually available as a roll of tape lined with a releasable film; the tape is cut into pieces together with the releasable film, and the releasable film is maintained until attachment to protect the ACF sheet 125 from foreign substances.

Figure 7B:
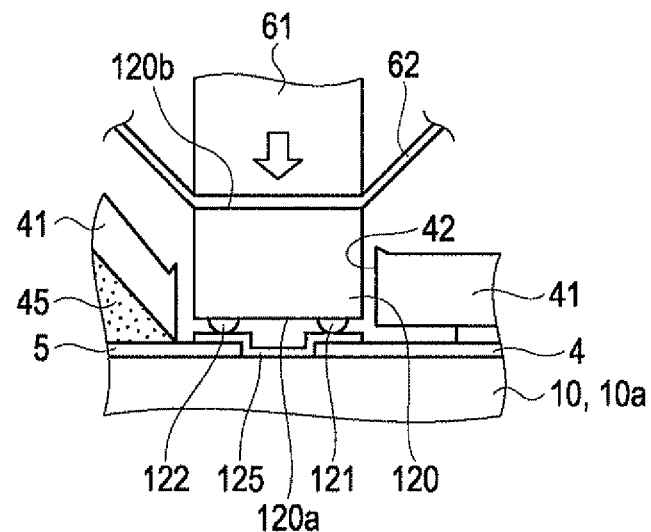
Figure 7C:
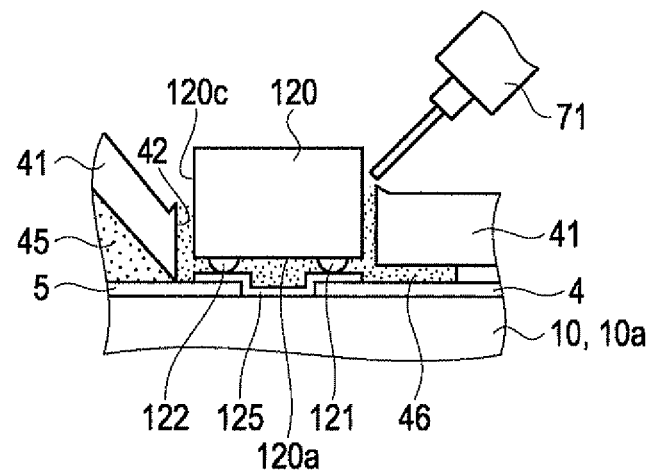

Then, the driver ICs 120 are so positioned in plan view that the active surfaces 120*a* thereof can face the terminal portion 10*a* exposed through the openings 42 of the protection film 41, as shown in FIG. 7B. An example of positioning methods is image recognition, in which the terminals 4 and 5 formed on the terminal portion 10*a* and the bumps 121 and 122 corresponding thereto are captured on an image and then aligned with reference to the image. For example, when the protection film 44, which covers the element substrate 10, is transparent, the driver ICs 120 can be positioned using an imager located to scan the active surfaces 120*a*.

Then, a thermal compression tool 61 is brought into contact with the surface 120*b* of each driver IC 120 opposite to the active surface 120*a* with the releasable tape 62 as the insert, and the driver ICs 120 are pressed on the terminal portion 10*a* and heated until bonding is completed. An example of thermal compression conditions is as follows: temperature of the thermal compression tool 61: about 180° C.; pressure applied to the driver ICs 120: about 300 N; duration of compression: about 10 seconds. IC bonding is finished in this way, and manufacturing proceeds to Step S3.

In Step S3, molding, the space defined by the side walls 120*c* of the bonded driver ICs 120 and the inner walls of the openings 42 is filled with a moldable material 46. An example of filling methods is one in which a dispenser 71 is used to discharge the moldable material 46. When the silicone vapor barrier mentioned above (TSE3996) is used as the moldable material 46, TSE3996 is dispensed and then left stand under normal temperature and humidity conditions until moisture in the air cures TSE3996 into a rubber-like elastic material. Molding is finished in this way, and manufacture proceeds to Step S4.

Note that although IC bonding according to this embodiment involves the use of a thermosetting ACF sheet 125 to bond the driver ICs 120, a thermosetting adhesive containing no anisotropic conductive particles (NCP: non-conductive paste) may be applied to the terminal portion 10a before thermal compression of the driver ICs 120. In such a case, molding is unnecessary.

Figure 8A:
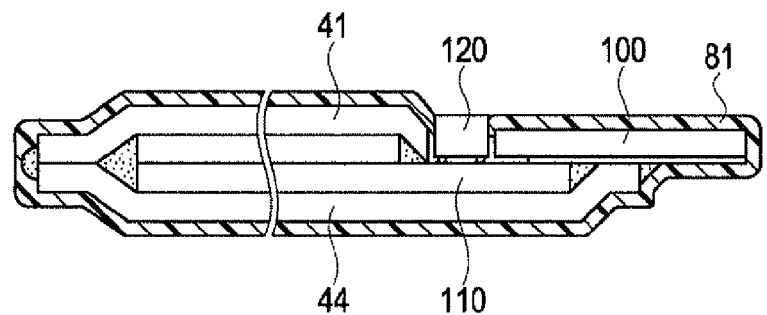
FIGS. 8A to 8D are schematic diagrams for an illustration of dry-etching.

In Step S4, dry-etching, the surface of the organic EL apparatus 100 is covered with a resist 81 first with the bonded driver ICs 120 exposed, as shown in FIG. 8A. An example of the resist 81 is an acrylic light-curing adhesive that can be dissolved in warm water after being cured. Methods for forming the resist 81 include dipping, spraying, and so forth. In dipping, the portions corresponding to the exposed driver ICs 120, or the openings 42, are masked, and then the organic EL apparatus 100 is dipped in the adhesive mentioned above and then taken out. In spraying, the adhesive is directly sprayed onto the organic EL apparatus 100.

Figure 8B:
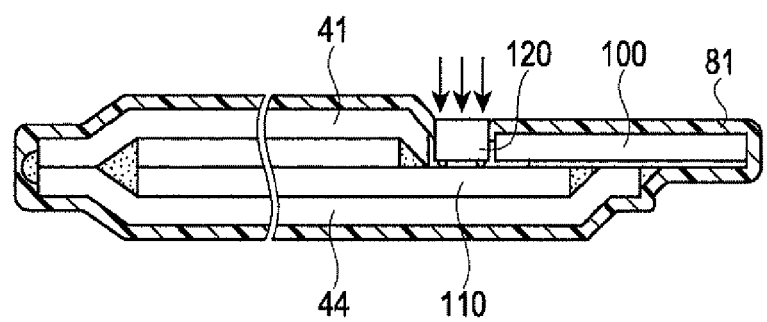
Figure 8C:
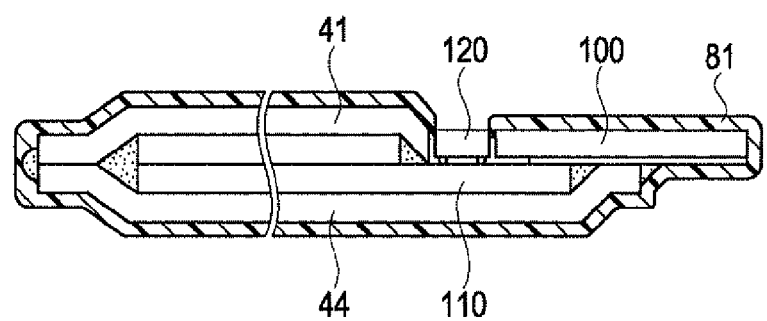

Then, the organic EL apparatus 100 is loaded into a parallel-plate RIE (reactive ion etching) apparatus for dry-etching of the driver ICs 120 conducted as shown in FIG. 8B. More specifically, reactive gases, $CF_4$ (carbon tetrafluoride) and $O_2$ (oxygen), are introduced into a degassed chamber under the following conditions: chamber pressure: about 30 Pa; $CF_4$ flow rate: 50 sccm; $O_2$ flow rate: 5 sccm; distance between electrodes: 60 mm; output: about 200 W. Under these conditions, the rate of etching is approximately 0.8 μm/min. The driver ICs 120 can be thinned to any desired thickness as shown in FIG. 8C by adjustment of the duration of etching.

Figure 8D:
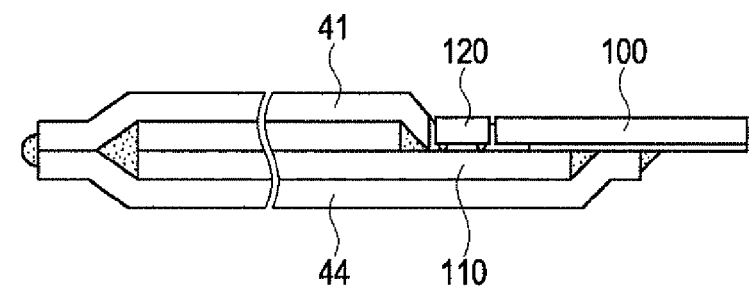

Then, the resist 81 is removed from the organic EL apparatus 100 as shown in FIG. 8D. An example of possible methods is as follows: the organic EL apparatus 100 is immersed in pure water warmed in advance to about 90° C. (hot water) for 5 to 10 minutes so that the resist 81 can detach. Desirably, hot water is stirred, or sonication is applied with a frequency of not more than 70 kHz. Rinsing with pure water may be added, if necessary. Dry-etching is finished in this way, and manufacture proceeds to Step S5.

In Step S5, installation of heat radiation material, adhesive heat radiation materials 123 are attached to overlap with the surface of the exposed driver ICs 120 as shown in FIGS. 1 and 4. In FIG. 1, the width of each heat radiation material 123 is smaller than the length of the corresponding driver IC 120 for easy understanding of the configuration; however, the area of each heat radiation material 123 had better be maximized as it can for efficient heat radiation. At this point, the driver ICs 120 are as thin as or thinner than the protection film 41, and thus the heat radiation materials 123 may be large in area enough to completely cover the openings 42.

This method for manufacturing organic EL apparatuses, in which a thin organic EL panel 110 is sealed with protection films 41 and 44 and then driver ICs 120 are bonded thereto, allows easier handling of the organic EL apparatus 100 in IC bonding and later steps. Furthermore, it avoids warps unless a bending stress or other kinds of stress are applied to the organic EL apparatus 100, thereby improving the yield and the positional accuracy of the driver ICs 120.

Since bonding of the driver ICs 120 precedes thinning, the driver ICs 120 can be handled more easily than in the case where thinning precedes bonding, and this prevents defects such as damaged driver ICs from occurring.

In this way, this method makes it possible to manufacture flexible and reliable organic EL apparatuses at a high yield.

Embodiment 2

Another Form of Electro-Optic Apparatuses

Figure 10:
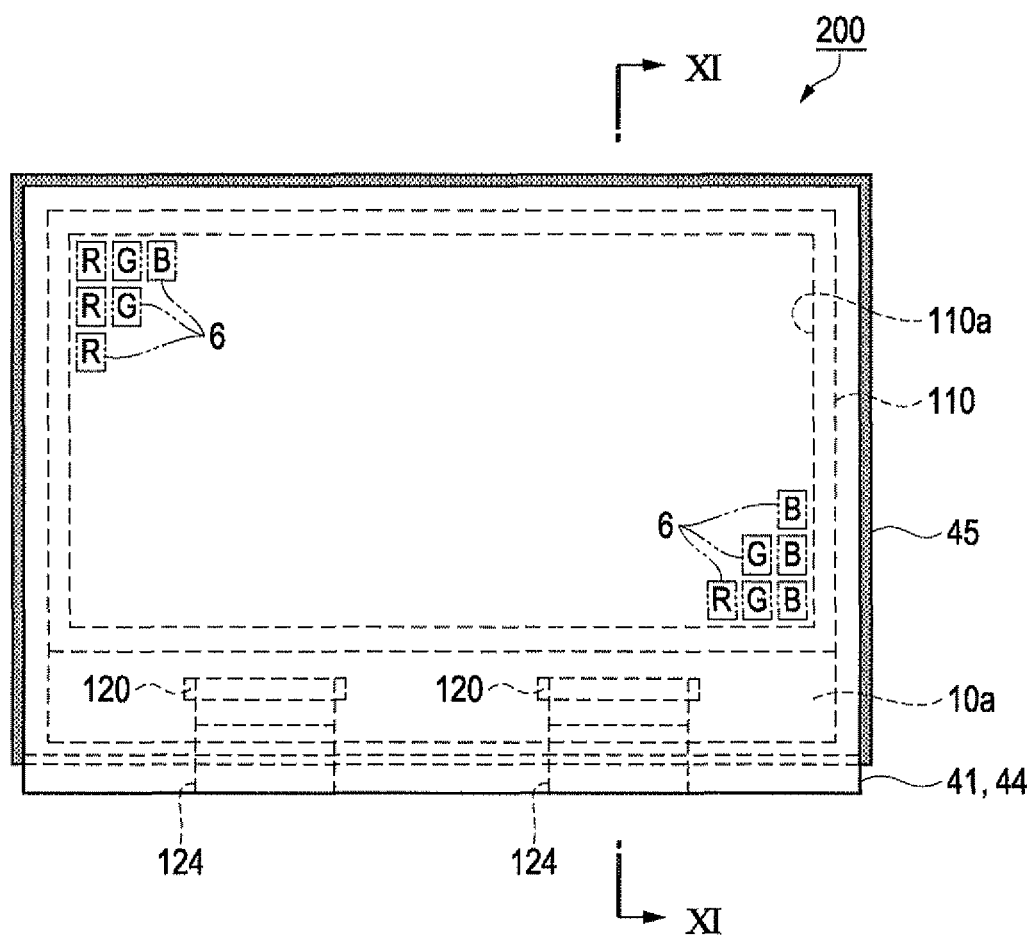
FIG. 10 is a schematic plan view of a configuration of an organic EL apparatus according to Embodiment 2.
Figure 11:
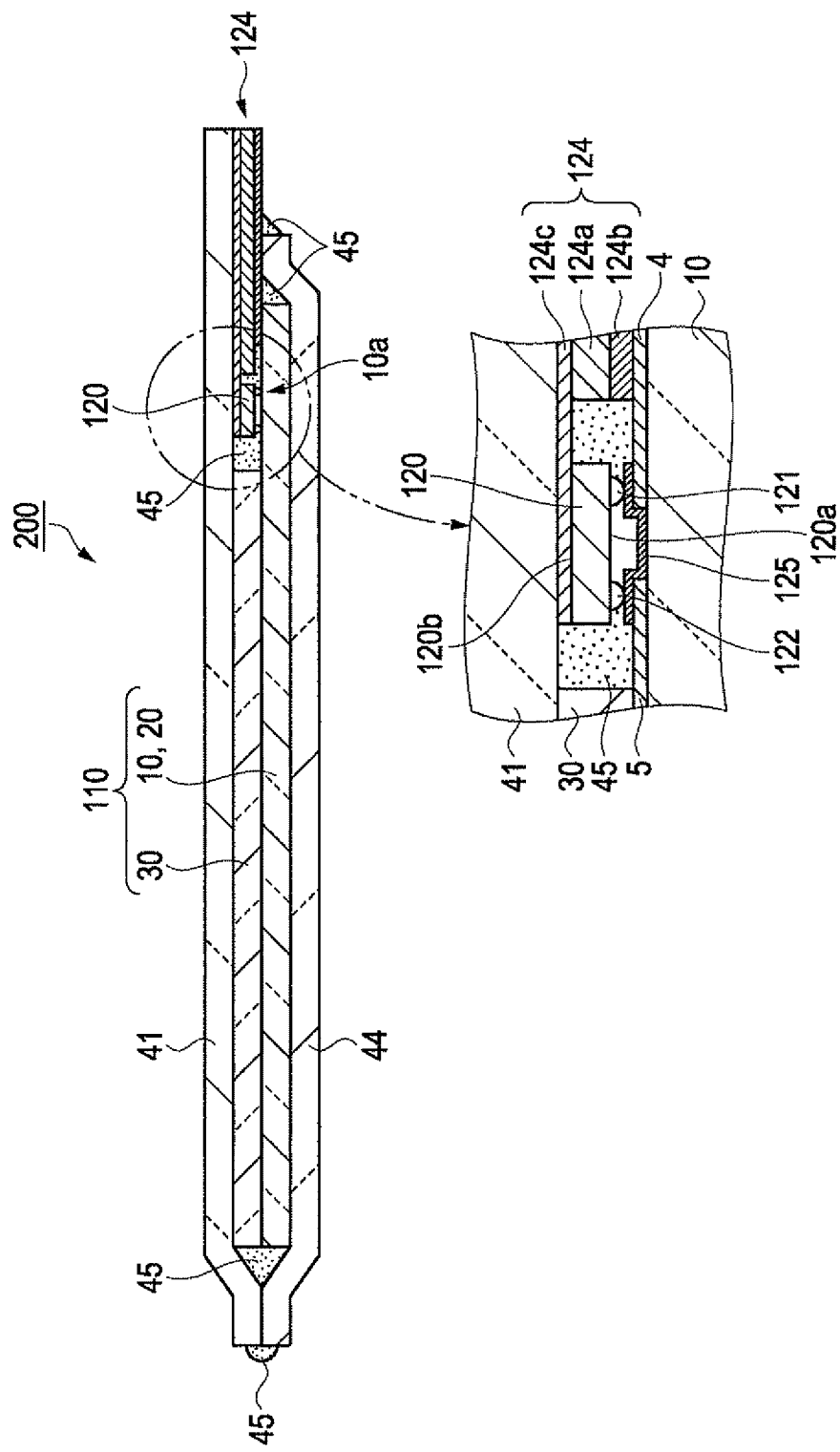
FIG. 11 is a schematic cross-sectional view of an organic EL apparatus taken along line XI-XI in FIG. 10.

The following describes another form of electro-optic apparatuses, which is according to Embodiment 2 of an aspect of the invention, with reference to FIGS. 10 and 11. The electro-optic apparatus according to Embodiment 2 is different from the electro-optic apparatus 100, which is according to Embodiment 1, only in that an electro-optic panel have its terminal portion mounted with driver semiconductor chips before sealed by being sandwiched between two protection films; in other words, none of the two protection films have openings for exposing the driver semiconductor chips. Thus, the components used in the organic EL apparatus 100 are referenced by the same numbers as in Embodiment 1 and are not detailed any more.

FIG. 10 is a schematic plan view of a configuration of an organic EL apparatus according to Embodiment 2, and FIG. 11 is a schematic cross-sectional view of the organic EL apparatus taken along line XI-XI in FIG. 10.

As shown in FIG. 10, the organic EL apparatus 200, which is an electro-optic apparatus according to Embodiment 2, has an organic EL panel 110 and two protection films 41 and 44. The organic EL panel 110 is rectangular in plan view and is sealed by being sandwiched between the protection films 41 and 44 (see FIG. 11 for details).

The organic EL panel 110, which is an electro-optic panel, has pixels 6. Each pixel 6 has a roughly rectangular shape and emits red (R), green (G), or blue (B) light. Pixels 6 of the same color are aligned parallel to the short sides, and pixels 6 of different colors are repeated parallel to the long sides, constituting a luminous area 110a of so-called stripe pixel arrangement. Note that the order of pixels 6 of different colors is never limited to that shown in the drawing.

The organic EL panel 110 has a terminal portion 10a, onto which some driver ICs 120 (in the drawing, two driver ICs 120) are bonded for the use as the driver semiconductor chips. In other words, the organic EL panel 110 is sealed with the two protection films 41 and 44 with the terminal portion 10a thereof mounted with the driver ICs 120. Each driver IC 120 has a thin rectangular shape in plan view; for example, the short side measures 1.5 to 2 mm in length, where as the long side 15 to 20 mm in length.

The sealed organic EL panel 110 further has flexible printed circuits (FPCs) 124 sandwiched between each driver IC 120 and the protection film 41. Each FPC 124 has a width similar to that of the corresponding driver IC 120 and overlaps with at least the surface of the driver IC 120 opposite to the active surface and the terminal portion 10a.

Therefore, the organic EL apparatus 200 has a structure in which an organic EL panel 110 that carries driver ICs 120 thinned and bonded thereto in advance is sealed (laminated) by being sandwiched between two protection films 41 and 44, as shown in FIG. 11.

In each driver IC 120, bumps 121 and 122 of the active surface 120a are welded under pressure for electric connection via an ACF sheet 125 to terminals 4 and 5 formed above the terminal portion 10a. The bumps 121 and 122 are electrodes for bonding and made of Au or the like on the land of the active surface 120a.

As described above, each driver IC 120 has a thin rectangular shape in plan view; it is made from a silicon wafer having a thickness in the range of 300 to 400 μm. In this embodiment, the driver ICs 120 are bonded onto the terminal portion 10*a* and then thinned to a thickness on the order of 5 to 50 μm. This ensures the reliability of the resultant organic EL apparatus 200 in terms of internal connection because the driver ICs 120 can be deformed by following any bending stress and other kinds of stress applied to the organic EL apparatus 200. For the balance of productivity and reliability, the final thickness of the driver ICs 120 is preferably in the range of 10 to 30 μm. Specific treatments for thinning the driver ICs 120 will be described later.

The space lying around the driver ICs 120, which are bonded in advance onto the terminal portion 10*a*, is filled with a sealing resin 45, and thus the active surface 120*a* is sealed so that the reliability in terms of internal connection can be ensured. The sealing resin 45 is a resin material that becomes elastic after being cured and thus can follow any deformation of the organic EL apparatus 200. An example of eligible sealing materials is TSE3996, a silicone vapor barrier from Momentive Performance Materials Inc. (former GE Toshiba Silicone).

As described above, the driver ICs 120 generate a considerable amount of heat from current flow during the operation of the organic EL panel 110. Thus, the surface 120*b* of each driver IC 120 opposite to the active surface 120*a* has a heat radiation material 124*c* attached to overlap therewith.

In practice, an insulating and flexible base 124*a*, a heat radiation material 124*c* attached to one surface thereof, and a connection 124*b* provided on the other surface thereof constitute each of the FPCs 124 described above, sandwiched between the terminal portion 10*a* and the protection film 41. The heat radiation materials 124*c* extends beyond the bases 124*a*, and the extensions are sandwiched between the surface 120*b* of the driver ICs 120 and the protection film 41.

The heat radiation materials 124*c* are made from, for example, a heat transfer body such as a metal foil, or a resin film obtained by laminating heat transfer bodies. In particular, Pyrolytic Graphite Sheet (PGS; Panasonic Corporation) can be suitably used because of its flexibility and excellent heat transfer.

The connections 124*b*, which are provided on the surface of the bases 124*a* opposite to the heat radiation materials 124*c*, are, for example, patterned copper foils. They are electrically connected by overlapping with an input terminal 4 provided on the terminal portion 10*a*.

The FPCs 124 extend to one end of the protection film 41, and the connections 124*b* are exposed at least in part as the sealing of the organic EL panel 110 with the two protection films 41 and 44 is so made as to ensure that. The exposed areas of the connections 124*b* communicate with an external driving circuit, and the heat radiation materials 124*c* radiate heat generated in the driver ICs 120.

The two protection films 41 and 44, which seal the organic EL panel 110, are preferably transparent resin films of low gas-permeability so that they can block out moisture, gas, and any other foreign substances.

Examples of eligible resin films include ones made of PET, PEN, or some other kind of polyester, and ones made of PES, PC, PE, or some other similar resin; laminates of these films may be used instead. The thickness of each resin film or laminate is about 50 μm.

Each resin film or laminate has its surface for sealing the organic EL panel 110 coated with an adhesive. An example of eligible adhesives is a thermosetting epoxy resin. A viscous adhesive may be used instead; it helps repair.

With the surface coated with an adhesive facing one another, the two protection films 41 and 44 are laminated to seal the organic EL panel 110. Although the obtained laminate potentially contains some spaces around the organic EL panel 110, such spaces are filled with the sealing resin 45 before lamination so that the vapor barrier, or moisture-tightness, of organic EL elements 20 can be ensured. In other words, the organic EL panel 110 and the sealing resin 45 are sealed together. The sealing resin 45 protrudes in part, making projections on the edges of the protection films 41 and 44.

The organic EL panel 110 is a top-emission EL panel; thus, the protection film 41, which covers a sealing substrate 30 (the side used for light emission), should be transparent so that light can pass through. However, the protection film 41, which covers an element substrate 10 (the side not used in light emission), may be non-transparent; for example, it may be a laminate of a heat transfer body, such as a metal thin film, and a non-transparent resin film. The heat transfer body helps radiation of the heat generated as a result of light emission by the organic EL elements 20.

Method for Manufacturing Electro-Optic Apparatuses in this Form

Figure 12:
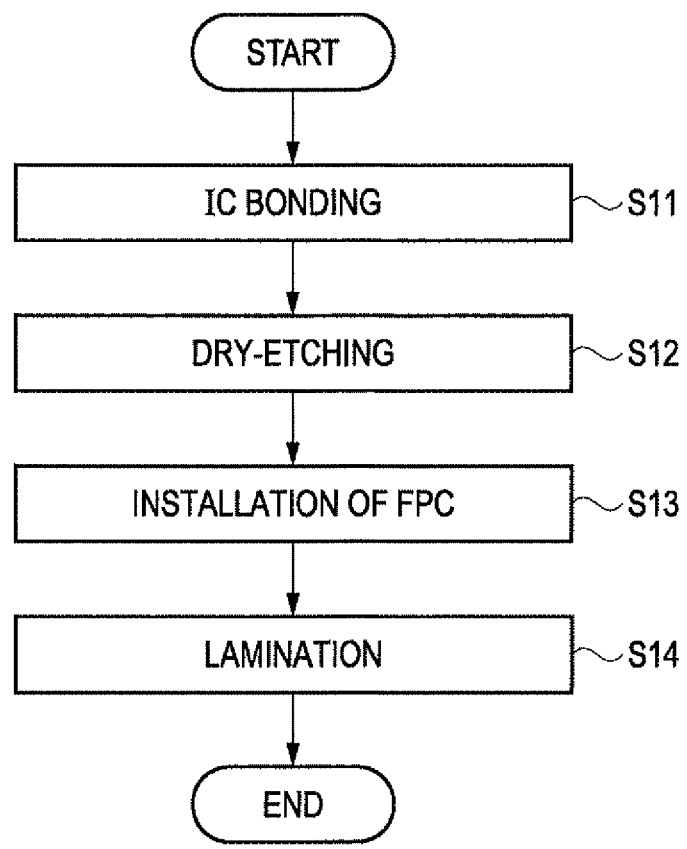
FIG. 12 is a flow chart that shows a manufacturing method of an organic EL apparatus according to Embodiment 2.

The following describes a method for manufacturing an organic EL apparatus in the form described above, an example of electro-optic apparatuses according to Embodiment 2 of an aspect of the invention, with reference to FIGS. 12 to 15. FIG. 12 is a flow chart that shows a manufacturing method of an organic EL apparatus according to Embodiment 2, FIGS. 13A and 13B are schematic diagrams for an illustration of IC bonding, FIGS. 14A to 14D are schematic diagrams for an illustration of dry-etching, and FIGS. 15A to 15C are schematic diagrams for an illustration of lamination.

As shown in FIG. 12, a method for manufacturing the organic EL apparatus 200, which is according to Embodiment 2, includes IC bonding (S11), dry-etching (S12), installation of FPC (S13), and lamination (sealing; S14). Note that preparation of the organic EL panel 110 can be completed by any known methods, and thus no description is given to it.

Figure 13A:
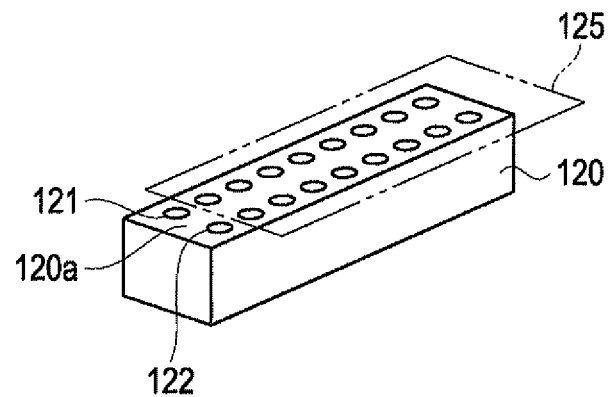
FIGS. 13A and 13B are schematic diagrams for an illustration of IC bonding.

In Step S11, IC bonding, an ACF sheet 125 cut to a predefined size is attached to the active surface 120*a* of each driver IC 120 as shown in FIG. 13A. ACF is usually available as a roll of tape lined with a releasable film; the tape is cut into pieces together with the releasable film, and the releasable film is maintained until attachment to protect the ACF sheet 125 from foreign substances.

Figure 13B:
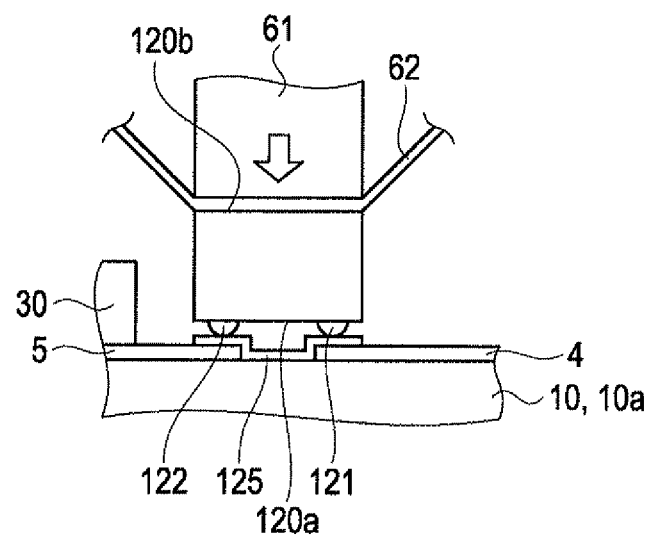

Then, the driver ICs 120 are so positioned in plan view that each active surface 120*a* and the terminal portion 10*a* of the organic EL panel 110 face each other, as shown in FIG. 13B. An example of positioning methods is image recognition, in which the terminals 4 and 5 formed on the terminal portion 10*a* and the bumps 121 and 122 corresponding thereto are captured on an image and then aligned with reference to the image. For example, when the element substrate 10 is transparent, the driver ICs 120 can be positioned using an imager located to scan the active surfaces 120*a*.

Then, a thermal compression tool 61 is brought into contact with the surface 120*b* of each driver IC 120 opposite to the active surface 120*a* with the releasable tape 62 as the insert, and the driver ICs 120 are pressed on the terminal portion 10*a* and heated until bonding is completed. An example of thermal compression conditions is as follows: temperature of the thermal compression tool 61: about 180° C.; pressure applied to the driver ICs 120: about 300 N; duration of compression: about 10 seconds.

Although not shown in the drawing, it is preferable that a sealing resin 45 be applied to the vicinities of the bonded driver ICs 120 for sealing of the active surfaces 120*a*.

Note that although IC bonding according to this embodiment involves the use of a thermosetting ACF sheet 125 to bond the driver ICs 120, a thermosetting adhesive containing no anisotropic conductive particles (NCP) may be applied to the terminal portion 10a before thermal compression of the driver ICs 120. In such a case, the active surfaces 120a can be sealed on the terminal portion 10a without application of the sealing resin 45. IC bonding is finished in this way, and manufacture proceeds to Step S12.

Figure 14A:
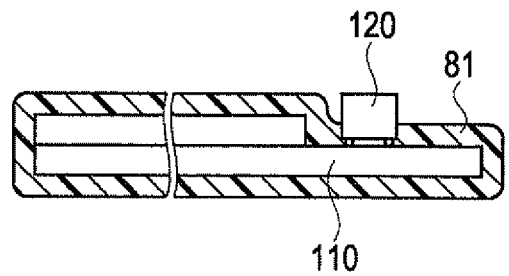
FIGS. 14A to 14D are schematic diagrams for an illustration of dry-etching.

In Step S12, dry-etching, the surface of the organic EL panel 110 is covered with a resist 81 first with the bonded driver ICs 120 exposed, as shown in FIG. 14A. An example of the resist 81 is an acrylic light-curing adhesive that can be dissolved in warm water after being cured. Methods for forming the resist 81 include dipping, spraying, and so forth. In dipping, the exposed driver ICs 120 are masked, and then the organic EL panel 110 is dipped in the adhesive mentioned above and then taken out. In spraying, the adhesive is directly sprayed onto the organic EL panel 110.

Figure 14B:
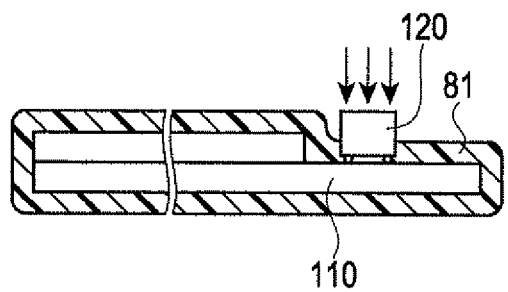
Figure 14C:
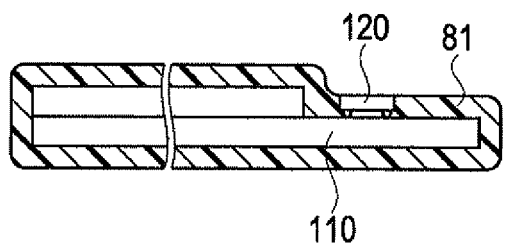

Then, the organic EL panel 110 is loaded into a parallel-plate RIE apparatus for dry-etching of the driver ICs 120 conducted as shown in FIG. 14B. More specifically, reactive gases, $CF_4$ and $O_2$, are introduced into a degassed chamber under the following conditions: chamber pressure: about 30 Pa; $CF_4$ flow rate: 50 sccm; $O_2$ flow rate: 5 sccm; distance between electrodes: 60 mm; output: about 200 W. Under these conditions, the rate of etching is approximately 0.8 μm/min. The driver ICs 120 can be thinned to any desired thickness as shown in FIG. 14C by adjustment of the duration of etching.

Figure 14D:
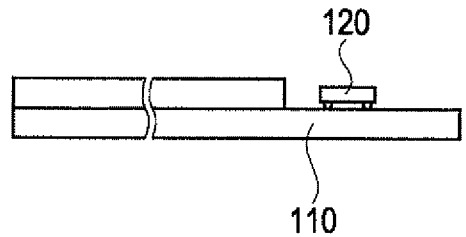

Then, the resist 81 is removed from the organic EL panel 110 as shown in FIG. 14D. An example of possible methods is as follows: the organic EL panel 110 is immersed in pure water warmed in advance to about 90° C. (hot water) for 5 to 10 minutes so that the resist 81 can detach. Desirably, hot water is stirred, or sonication is applied with a frequency of not more than 70 kHz. Rinsing with pure water may be added, if necessary. Dry-etching is finished in this way, and manufacture proceeds to Step S13.

In Step S13, installation of FPC, FPCs 124 are mounted in such a manner that the area of each heat radiation material 124c extending beyond the organic EL panel 110 can overlap with the corresponding driver IC 120 and that the connections 124b can overlap with the terminal portion 10a. Examples of methods for mounting the FPCs 124 include one in which an adhesive heat-transfer layer is inserted between the extension of each heat radiation material 124c and the surface of each driver IC 120 opposite to the active surface 120a, one in which an ACF sheet is inserted between each connection 124b and the terminal portion 10a, and so forth. Installation of FPC is finished in this way, and manufacturing proceeds to Step S14; Step S13 is one of preliminary steps to Step S14.

In Step S14, lamination, components are stacked to prepare a lead-up as shown in FIG. 15E, and the obtained lead-up is loaded into a laminator. More specifically, the organic EL panel 110 is placed on a protection film 44, and the obtained composition is covered with a protection film 41. Although not clear in FIG. 153, the components are stacked with their positions in plan view aligned. This step may be performed under normal conditions or with the pressure reduced; however, a reduced pressure is advantageous to sealing and thus is used here. The laminator has a pressure-controlled chamber, although FIG. 15B shows pressure rollers 51 and 52 only.

After the lead-up is loaded into the laminator, the chamber is depressurized. This removes air (bubbles) from the lead-up.

The pressure rollers 51 and 52, whose surface is made of a heat conductive elastomer, are heated to a temperature in the range of 80 to 120° C.

Figure 15A:
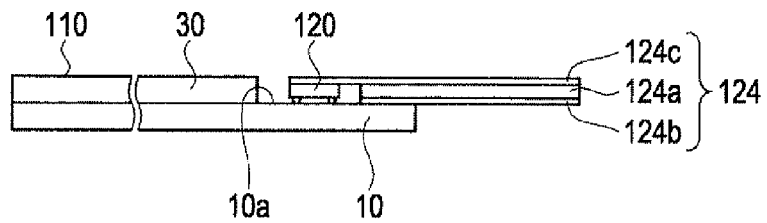
FIGS. 15A to 15C are schematic diagrams for an illustration of lamination.
Figure 15B:
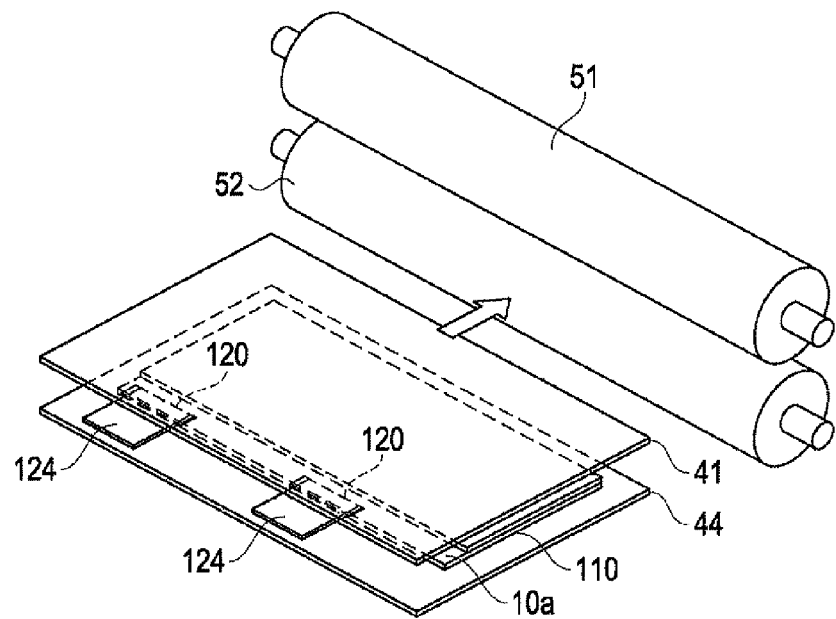

Lamination (sealing) begins from the side of the lead-up opposite to the terminal portion 10a of the organic EL panel 110 and proceeds in the direction indicated by the arrow in FIG. 15B. The pressure rollers 51 and 52 heat and compress the organic EL panel 110 and the protection films 41 and 44 sandwiching it so that they can be combined by bonding. Note that the protection films 41 and 44 are bonded to each other in the area not occupied by the organic EL panel 110.

Since lamination proceeds in the direction from a side to the opposite side, bubbles (air) remaining in the components, if any, would be extruded from the rear end.

Figure 15C:
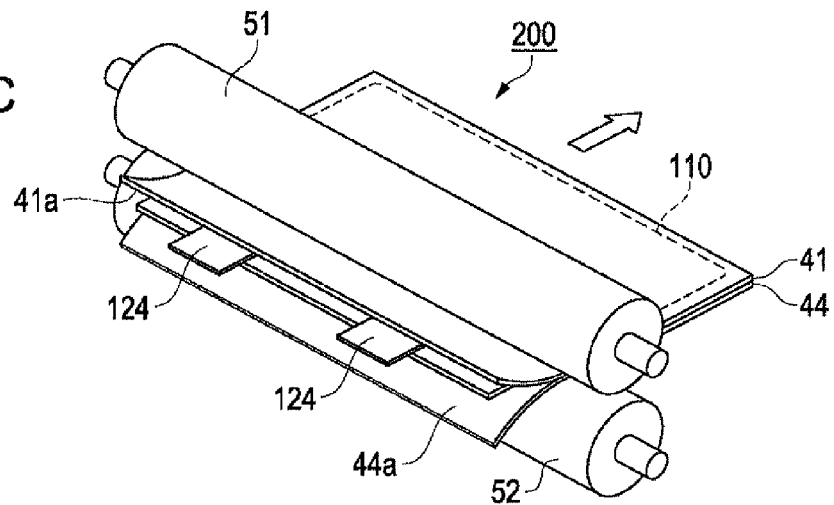

As described above, the resultant laminate often contains some spaces around the organic EL panel 110, and thus the sealing resin 45 is applied in advance to the four edges and the terminal portion 10a of the organic EL panel 110. Thus, an excess of the sealing resin 45 is extruded toward the edges of the protection films 41 and 44. Then, the laminate of an organic EL apparatus 200 is discharged by the pressure rollers 51 and 52 as shown in FIG. 15C. In this way, lamination is completed.

Desirably, annealing is performed here so that residual stress can be removed from the laminate of the organic EL apparatus 200. The reduced pressure may be maintained or returned to normal. Although in this embodiment the protection films 41 and 44 have their adhesion surfaces 41a and 44a coated with an adhesive as shown in FIG. 15C, hot-melt resin films containing a cross-linking component may be used instead; in such a case, it is particularly preferable that cross-linking be completed by annealing at about 100° C.

The type of laminator is never limited to roller laminator; the laminator does not always have to be equipped with the pressure rollers 51 and 52. For example, the laminator may be a diaphragm vacuum laminator, in which the lead-up is heated and compressed on a hot plate by a flexible rubber sheet pressed thereon using pressure difference.

This method for manufacturing organic EL apparatuses, in which bonding of the driver ICs 120 to the thin organic EL panel 110 precedes thinning of the driver ICs 120, allows easier handling of the driver ICs 120 in IC bonding than in the case where thinning precedes IC bonding. Furthermore, it improves the yield and the positional accuracy of the driver ICs 120.

The resultant organic EL apparatus 200, in which the organic EL panel 110 mounted with the driver ICs 120 is sealed with the two protection films 41 and 44, is easy to handle and free from defects such as damaged driver ICs.

In this way, this method makes it possible to manufacture flexible and reliable organic EL apparatuses at a high yield.

Embodiment 3

Electronic Devices

Figure 16A:
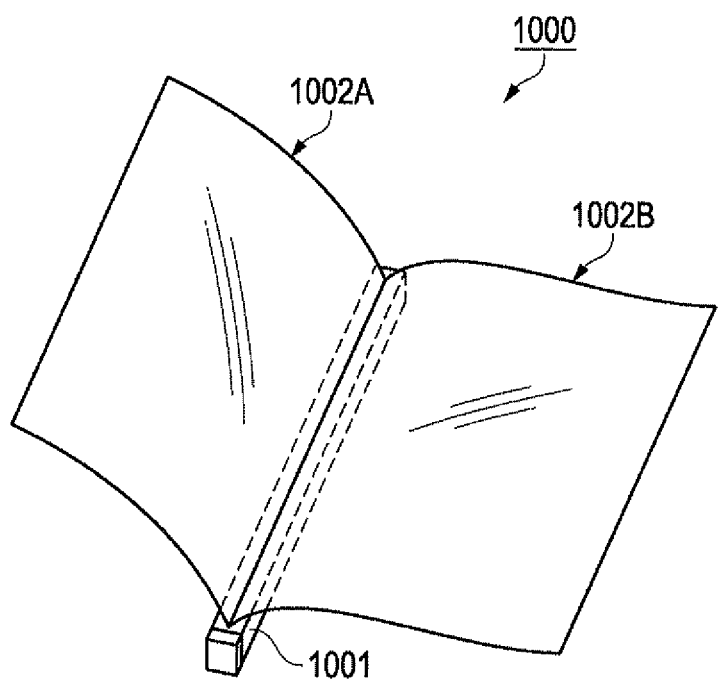
FIGS. 16A and 16B are schematic diagrams showing examples of electronic devices.
Figure 16B:
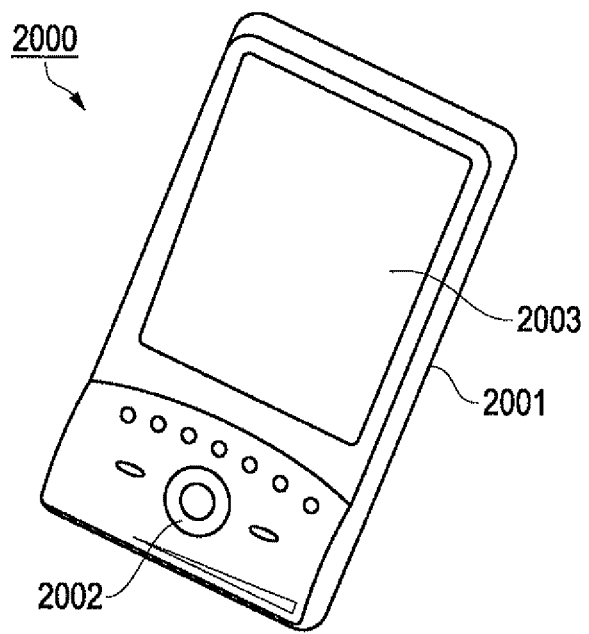

The following describes electronic devices according to an aspect of the invention with reference to FIG. 16. FIGS. 16A and 16B are schematic diagrams showing examples of electronic devices: FIG. 16A shows a display, and FIG. 16B shows a PDA.

FIG. 16A shows a display 1000, an example of electronic devices. The display 1000 is a book-like display whose electronic paper displays 1002A and 1002B are constituted by the organic EL apparatus 100, which is according to Embodiment 1 described above, or the organic EL apparatus 200, which is according to Embodiment 2 described above. The binding margin is a hinge 1001, which has a connector (not shown in the drawing) that can be connected to the connections 43 of the organic EL apparatus 100 or the FPCs 124 of the organic EL apparatus 200.

The connector is attached to the hinge 1001 so that it can rotate around an axis, thereby allowing the electronic paper sheets 1002A and 1002B to be turned over like pages of a paper book. The electronic paper sheets 1002A and 1002B may be detachably connected to the hinge 1001. As a result, any desired number of electronic paper sheets can be carried with the display 1000 like filler for a binder.

FIG. 16B shows a PDA 2000, another example of electronic devices. The PDA 2000 has the body 2001, on which buttons 2002 and a display 2003 are arranged. The body 21 fits in the palm of a hand, and the display 2003 carries the organic EL apparatus 100, which is according to Embodiment 1 described above, or the organic EL apparatus 200, which is according to Embodiment 2 described above. When one or more buttons 2002 are pressed, the display 2003 shows various kinds of information, such as an address book or a schedule. Since the organic EL apparatus 100 and the organic EL apparatus 200 are thin and light-emitting displays, the body 2001 can be thinner than usual, thereby downsizing the PDA 2000 itself.

Additionally, the organic EL panel 110 is sealed with the protection films 41 and 44 and thus is robust to external impact such as an accidental fall of the PDA 2000. Even if the organic EL panel 110 is unfortunately broken, fragments are sealed in the PDA 2000, causing no injuries.

Electronic devices that can carry the organic EL apparatus 100 or the organic EL apparatus 200 are never limited to those described above, namely, book-like displays and PDAs; various kinds of electronic devices can carry the organic EL apparatus 100 or the organic EL apparatus 200, for example: personal computers, digital still cameras, digital video cameras, DVD viewers, vehicle-mounted displays for car navigation systems or the like, electronic organizers, POS terminals, and electronic advertising media also known as digital signage.

Besides the embodiments described above, various modifications are possible. The following describes some of possible modifications.

Modification 1

Figure 9:
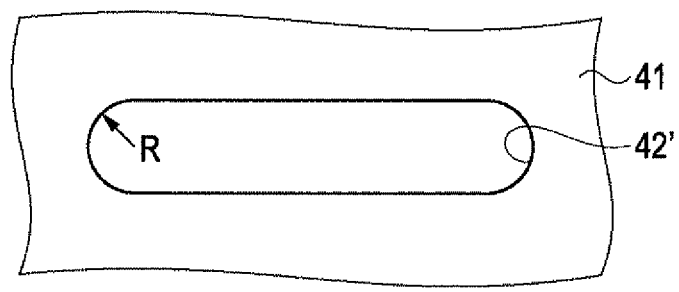
FIG. 9 is a plan view of an opening used in a variation of an aspect of the invention.

In the organic EL apparatus 100, which is according to Embodiment 1 described above, the shape of the openings 42 on the protection film 41 is never limited to rectangular in flat view. FIG. 9 is a plan view of the shape of an opening used in this modification. As shown in FIG. 9, the opening 42' has arcs on its short sides like a running track. If having such openings 42', the protection film 41 has no corners and thus is unlikely to tear during pressing for forming the openings 42', and thus the yield of pressing is improved.

Modification 2

Both in the organic EL apparatus 100, which is according to Embodiment 1 described above, and the organic EL apparatus 200, which is according to Embodiment 2 described above, the constitution of the organic EL panel 110 is never limited to that described above. For example, the color filters 32 of the sealing substrate 30 may be omitted for monochromatic light emission (white light). With this constitution, the organic EL apparatus 100 or the organic EL apparatus 200 can be used not as a display but as an illuminator.

When the organic EL apparatus 100 or 200 is used as an illuminator, the driving mode of the organic EL elements 20 of the organic EL panel 110 is not limited to the active matrix mode; the passive matrix mode may be used instead.

Also, the structure of the organic EL panel 110 is not limited to the top-emission form, in which light is emitted from the sealing substrate 30; the bottom-emission form, in which light is emitted from the element substrate 10, may be used instead.

Modification 3

In the organic EL apparatus 100, which is according to Embodiment 1 described above, the driver ICs 120 need not be thinned. When the organic EL apparatus 100 is installed under no bending stress or any other kinds of stress and used as a thin display or illuminator, the trouble of thinning the driver ICs 120 after bonding them can be saved; in other words, thinning of the driver ICs 120 can be omitted.

Modification 4

Electro-optic apparatuses to which aspects of the invention can be applied are never limited to the organic EL apparatus 100 and the organic EL apparatus 200. Aspects of the invention can be applied to liquid crystal displays, plasma displays, electrophoretic displays, electrochromic displays, and so forth as long as they carry an electro-optic panel equipped with the driver ICs 120 as driving semiconductor chips.

The entire disclosure of Japanese Patent Application No. 2009-186308, filed Aug. 11, 2009 and 2009-186307, filed Aug. 11, 2009 are expressly incorporated by reference herein.

What is claimed is:

1. An electro-optic apparatus comprising:
   an electro-optic panel that has a terminal portion;
   a driver semiconductor chip that is mounted on the terminal portion of the electro-optic panel; and
   a plurality of protection films including a first protection film and a second protection film, the first protection film being transparent,
   the electro-optic panel being sealed between the first protection film and the second protection film, and
   the first protection film covering the terminal portion of the electro-optic panel, the first protection film having an opening portion,
   the opening portion for exposing the driver semiconductor chip.

2. The electro-optic apparatus according to claim 1, wherein the electro-optic panel and the driving semiconductor chip are flexible.

3. The electro-optic apparatus according to claim 1, wherein the opening portion is large enough to surround the driver semiconductor chip, and a gap between an inner wall of the opening portion and a side wall of the driver semiconductor chip is filled with a moldable material so that an active surface of the driver semiconductor chip is sealed.

4. The electro-optic apparatus according to claim 3, wherein the moldable material is a resin material that becomes elastic after being cured.

5. The electro-optic apparatus according to claim 1, wherein:
   the electro-optic panel has a first substrate and a second substrate,
   the first substrate is a glass substrate and includes the terminal portion, and
   the opening portion is formed so that any burr occurring on an edge of the opening faces in a direction opposite to the terminal portion.

6. The electro-optic apparatus according to claim 1, wherein at least a part of the driver semiconductor chip overlaps with a heat radiation member in plan view.

7. The electro-optic apparatus according to claim 1, wherein the electro-optic panel is an organic EL panel having an organic EL element.

8. An electronic device comprising the electro-optic apparatus according to claims 1.

9. A method for manufacturing an electro-optic apparatus having an electro-optic panel sandwiched between a first protection film and a second protection film, the first protection film being transparent, and the electo-optic panel having a terminal portion comprising:

sealing the electro-optic panel between the first protection film and the second protection film, the first protection film having an opening corresponding in position to the terminal portion of the electro-optic panel; and bonding a driver semiconductor chip onto the terminal portion through the opening.

10. The method for manufacturing an electro-optic apparatus according to claim 9, further comprising:

molding for filling a moldable material in a gap between an inner wall of the opening and a side wall of the driver semiconductor chip and then curing it so that an active surface of the driver semiconductor chip can be sealed, wherein:

the opening is formed in advance on the first protection film with a size large enough to surround the driver semiconductor chip.

11. The method for manufacturing an electro-optic apparatus according to claim 10, wherein the moldable material is a resin material that becomes elastic after being cured.

12. The method for manufacturing an electro-optic apparatus according to claim 9, further comprising thinning the driver semiconductor chip by dry-etching.

13. The method for manufacturing an electro-optic apparatus according to claim 9, further comprising covering a surface of the driver semiconductor chip at least in part with a heat radiation material.

14. A method for manufacturing an electro-optic apparatus, comprising:

bonding a driver semiconductor chip onto a terminal portion of an electro-optic panel;

dry-etching the bonded driver semiconductor chip to achieve a smaller thickness of the driver semiconductor chip; and sealing the electro-optic panel, which has the driver semiconductor chip bonded thereonto and dry-etched to have a smaller thickness, between a first protection film and a second protection film, the first protection film being transparent.

15. The method for manufacturing an electro-optic apparatus according to claim 14, wherein the electro-optic panel is flexible, and the driver semiconductor chip has a thickness in the range of 5 to 50 µm after being dry-etched.

16. The method for manufacturing an electro-optic apparatus according to claim 14, wherein a heat radiation material is inserted between the driver semiconductor chip and each of the protection films before sealing.

17. The method for manufacturing an electro-optic apparatus according to claim 14, wherein the electro-optic panel is an organic EL panel, which carries an organic EL element.

* * * * *